(12) United States Patent
Tran et al.

(10) Patent No.: US 7,447,985 B2
(45) Date of Patent: Nov. 4, 2008

(54) **EFFICIENT DESIGN TO IMPLEMENT MIN\*\*/MIN\*\*– OR MAX\*\*/MAX\*\*-FUNCTIONS IN LDPC (LOW DENSITY PARITY CHECK) DECODERS**

(75) Inventors: Hau Thien Tran, Irvine, CA (US); Kelly Brian Cameron, Irvine, CA (US); Ba-Zhong Shen, Irvine, CA (US)

(73) Assignee: Broadcom Corporation, Irvine, CA (US)

(\*) Notice: Subject to any disclaimer, the term of this patent is extended or adjusted under 35 U.S.C. 154(b) by 529 days.

(21) Appl. No.: 11/172,165

(22) Filed: Jun. 30, 2005

(65) Prior Publication Data

US 2005/0246618 A1 Nov. 3, 2005

Related U.S. Application Data

(63) Continuation-in-part of application No. 10/901,528, filed on Jul. 29, 2004, now Pat. No. 7,017,106, and a continuation of application No. 10/369,168, filed on Feb. 19, 2003, now Pat. No. 7,107,511.

(60) Provisional application No. 60/630,360, filed on Nov. 22, 2004, provisional application No. 60/408,978, filed on Sep. 6, 2002, provisional application No. 60/427,979, filed on Nov. 20, 2002, provisional application No. 60/403,847, filed on Aug. 15, 2002.

(51) Int. Cl.
*G06F 11/00* (2006.01)
*H03M 13/00* (2006.01)

(52) U.S. Cl. .................................... 714/801

(58) Field of Classification Search ................ 714/800, 714/801, 807
See application file for complete search history.

(56) References Cited

U.S. PATENT DOCUMENTS

| | | | |
|---|---|---|---|
| 3,542,756 A | 11/1970 | Gallagher | |
| 3,665,396 A | 5/1972 | Forney, Jr. | |
| 4,295,218 A | 10/1981 | Tanner | |
| 5,406,570 A | 4/1995 | Berrou et al. | |
| 5,446,747 A | 8/1995 | Berrou | |

(Continued)

FOREIGN PATENT DOCUMENTS

| EP | 0 735 696 A2 | 10/1996 |
|---|---|---|
| EP | 0 735 696 A3 | 1/1999 |
| FR | 91 05278 A1 | 10/1992 |

OTHER PUBLICATIONS

J. Chen and M.P.C. Fossorier, "Near optimum universal belief propagation based decoding of low-density parity-check codes," IEEE Trans. Commun., vol. 50, No. 3, pp. 406-414, 2002.*

(Continued)

*Primary Examiner*—Shelly A Chase
(74) *Attorney, Agent, or Firm*—Garlick Harrison & Markison; Shayne X. Short

(57) ABSTRACT

Efficient design to implement min\*\*/min\*\*– or max\*\*/max\*\*– functions in LDPC (Low Density Parity Check) decoders. When compared to prior art approaches, the novel and efficient implementation presented herein allows for the use of substantially less hardware and surface area within an actual communication device implemented to perform these calculations. In certain embodiments, the min\*\* processing (and/or max\*\* processing) is implemented to assist in the computationally intensive calculations required to decoded LDPC coded signals. In one instance, this is operable to assist in check node processing when decoding LDPC coded signals. However, the efficient principles and architectures presented herein may be implemented within other communication device types to decode other types of coded signals as well. For example, the processing presented herein may perform calculations within a variety of decoders including LDPC decoders, turbo decoders, TTCM decoders, and/or other decoder types without departing from the scope and spirit of the invention.

20 Claims, 17 Drawing Sheets

U.S. PATENT DOCUMENTS

| | | | |
|---|---|---|---|
| 5,563,897 | A | 10/1996 | Pyndiah et al. |
| 6,065,147 | A | 5/2000 | Pyndiah et al. |
| 6,119,264 | A | 9/2000 | Berrou et al. |
| 6,122,763 | A | 9/2000 | Pyndiah et al. |
| 6,430,233 | B1 | 8/2002 | Dillon et al. |
| 6,473,010 | B1 | 10/2002 | Vityaev et al. |
| 6,567,465 | B2 | 5/2003 | Goldstein et al. |
| 6,633,856 | B2 | 10/2003 | Richardson et al. |
| 6,725,409 | B1 | 4/2004 | Wolf |
| 7,116,732 | B2 | 10/2006 | Worm et al. |
| 7,209,527 | B2 | 4/2007 | Smith et al. |
| 7,246,304 | B2 | 7/2007 | Kim |

OTHER PUBLICATIONS

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29 th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

Draft ETSI EN 302 307 V1.1.1 (Jun. 2004), Digital Video Broadcasting (DVB); Second generation framing structure, channel coding and modulation systems for Broadcasting, Interactive Services, News Gathering and other broadband satellite applications.

ETSI EN 302 307 V1.1.1 (Mar. 2005), Digital Video Broadcasting (DVB); Second generation framing structure, channel coding and modulation systems for Broadcasting, Interactive Services, News Gathering and other broadband satellite applications.

R. G. Gallager, "Low density parity check codes," IRE Trans. Info. Theory, vol. IT-8, pp. 21-28, Jan. 1962.

J. Hagenauer, E. Offer, and L. Papke, "Iterative decoding of binary block and convolutional codes," IEEE Transactions on Information Theory, pp. 429-445, Mar. 1996.

Mittelholzer, et al., "Reduced complexity decoding of low density parity check codes for generalized partial response channels," IEEE Tran. on Magnetics, vol. 37, No. 2, pp. 721-778, Mar. 2001.

P. Robertson, E. Villebrum, and P. Hoeher, "A comparison of optimal and suboptimal MAP decoding algorithms operating in the log domain," in Proc. Int. Conf. Communications, Seattle, WA, Jun. 1995, pp. 1009-1013.

Andrew J. Viterbi, "Am Intuitive Justification and a Simplified Implementation of the MAP Decoder for Convolutional Codes," IEEE Journal on Selected Areas in Communications, vol. 16, No. 2, pp. 260-264, Feb. 1998.

Xiao et al. "Efficient implementation of the sum-product algorithm for decoding LDPC," 2001 IEEE, pp. 1036-1036E.

Seog et al., "State-parallel MAP module design for turbo decoding of 3GPP," Apr. 2002, Journal of the Korean Physical Society, vol. 40, No. 4, pp. 677-685.

A. Raghupathy, K. J. Ray Liu, "A transformation for computational latency reduction in turbo-MAP decoding," Circuits and Systems, 1999. ISCAS apos; 99. Proceedings of the 1999 IEEE International Symposium on, vol. 4, Jul. 1999 pp.: 402-405 vol. 4.*

Patrick Robertson, Emmanuelle Villebrun, and Peter Hoeher, "A Comparison of Optimal and Sub-Optimal MAP Decoding Algorithms Operating in the Log Domain," 1995 IEEE International Conference on Communications, Gateway to Globalization, Seattle 1995, Proccedings of the International Conference on Communications (ICC), vol. 2, Jun. 18-22, 1995, pp. 1009-1013.*

J. Chen, A. Dholakia, E. Eleftheriou, M. Fossorier, X.-Y. Hu, "Near Optimal Reduced-Complexity Decoding Algorithms for LDPC Codes," 2002 IEEE International Symposium on Information Theory (ISIT 2002), Lausanne, Switzerland, Jun. 30-Jul. 5, 2002, p. 455.*

* cited by examiner

| A+B | ln(1+e^-(A+B)|) |
|---|---|
| 3.75 | 0 |
| 3.50 | 0 |
| 3.25 | 0 |
| 3.00 | 0 |
| 2.75 | 0 |
| 2.50 | 0 |
| 2.25 | 0 |
| 2.00 | 0 |
| 1.75 | 0 |
| 1.50 | 0 |
| 1.25 | 0.25 |
| 1.00 | 0.25 |
| 0.75 | 0.25 |
| 0.50 | 0.25 |
| 0.25 | 0.5 |
| 0.00 | 0.5 |
| -0.25 | 0.75 |
| -0.50 | 0.75 |
| -0.75 | 1 |
| -1.00 | 1.25 |
| -1.25 | 1.5 |
| -1.50 | 1.5 |
| -1.75 | 1.5 |
| -2.00 | 2 |
| -2.25 | 2.25 |
| -2.50 | 2.5 |
| -2.75 | 2.75 |
| -3.00 | 3 |
| -3.25 | 3.25 |
| -3.50 | 3.5 |
| -3.75 | 3.75 |
| -4.00 | 4 |

| A+B or A−B | ln(1+e^−|A+B|) or ln(1+e^−|A−B|) |
|---|---|
| 3.75 | 0 |
| 3.50 | 0 |
| 3.25 | 0 |
| 3.00 | 0 |
| 2.75 | 0 |
| 2.50 | 0 |
| 2.25 | 0 |
| 2.00 | 0 |
| 1.75 | 0 |
| 1.50 | 0 |
| 1.25 | 0.25 |
| 1.00 | 0.25 |
| 0.75 | 0.25 |
| 0.50 | 0.25 |
| 0.25 | 0.5 |
| 0.00 | 0.5 |
| −0.25 | 0.5 |
| −0.50 | 0.25 |
| −0.75 | 0.25 |
| −1.00 | 0.25 |
| −1.25 | 0.25 |
| −1.50 | 0 |
| −1.75 | 0 |
| −2.00 | 0 |
| −2.25 | 0 |
| −2.50 | 0 |
| −2.75 | 0 |
| −3.00 | 0 |
| −3.25 | 0 |
| −3.50 | 0 |
| −3.75 | 0 |
| −4.00 | 0 |

| A+B or A−B | $\ln(1-e^{-|A+B|})$ or $\ln(1-e^{-|A-B|})$ |
|---|---|
| 3.75 | -0.25 |
| 3.50 | -0.25 |
| 3.25 | -0.25 |
| 3.00 | -0.25 |
| 2.75 | -0.25 |
| 2.50 | -0.25 |
| 2.25 | -0.25 |
| 2.00 | -0.25 |
| 1.75 | -0.25 |
| 1.50 | -0.5 |
| 1.25 | -0.5 |
| 1.00 | -0.5 |
| 0.75 | -0.75 |
| 0.50 | -1 |
| 0.25 | -1.75 |
| 0.00 | -2.25 |
| -0.25 | -1.75 |
| -0.50 | -1 |
| -0.75 | -0.75 |
| -1.00 | -0.5 |
| -1.25 | -0.5 |
| -1.50 | -0.5 |
| -1.75 | -0.25 |
| -2.00 | -0.25 |
| -2.25 | -0.25 |
| -2.50 | -0.25 |
| -2.75 | -0.25 |
| -3.00 | -0.25 |
| -3.25 | -0.25 |
| -3.50 | -0.25 |
| -3.75 | -0.25 |
| -4.00 | -0.25 |

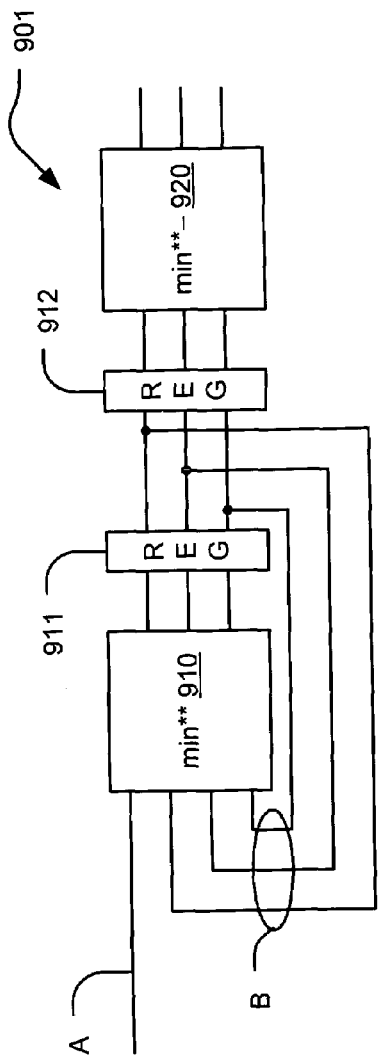
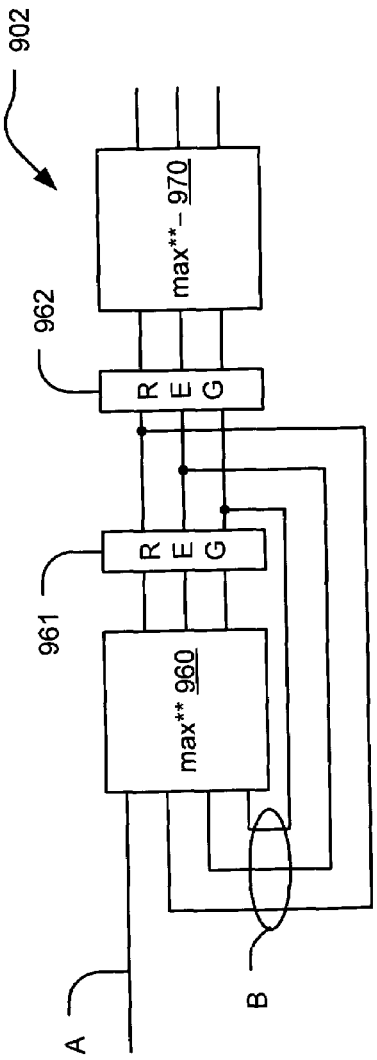
Fig. 9A
Fig. 9B

| A − B | $\ln(1+e^{-|A-B|})$ |
|---|---|
| 3.75 | 0 |
| 3.50 | 0 |
| 3.25 | 0 |
| 3.00 | 0 |
| 2.75 | 0 |
| 2.50 | 0 |
| 2.25 | 0 |
| 2.00 | 0 |
| 1.75 | 0 |
| 1.50 | 0 |
| 1.25 | 0.25 |
| 1.00 | 0.25 |
| 0.75 | 0.25 |
| 0.50 | 0.25 |
| 0.25 | 0.5 |
| 0.00 | 0.5 |
| −0.25 | 0.5 |
| −0.50 | 0.25 |
| −0.75 | 0.25 |
| −1.00 | 0.25 |
| −1.25 | 0.25 |
| −1.50 | 0 |
| −1.75 | 0 |
| −2.00 | 0 |
| −2.25 | 0 |
| −2.50 | 0 |
| −2.75 | 0 |
| −3.00 | 0 |
| −3.25 | 0 |
| −3.50 | 0 |
| −3.75 | 0 |
| −4.00 | 0 |

| A + B | $-\ln(1+e^{-|A+B|})$ |
|---|---|
| 3.75 | 0 |
| 3.50 | 0 |
| 3.25 | 0 |
| 3.00 | 0 |
| 2.75 | 0 |
| 2.50 | 0 |
| 2.25 | 0 |
| 2.00 | 0 |
| 1.75 | 0 |
| 1.50 | 0 |
| 1.25 | −0.25 |
| 1.00 | −0.25 |
| 0.75 | −0.25 |
| 0.50 | −0.25 |
| 0.25 | −0.5 |
| 0.00 | −0.5 |
| −0.25 | −0.5 |
| −0.50 | −0.25 |
| −0.75 | −0.25 |
| −1.00 | −0.25 |
| −1.25 | −0.25 |
| −1.50 | 0 |
| −1.75 | 0 |
| −2.00 | 0 |
| −2.25 | 0 |
| −2.50 | 0 |
| −2.75 | 0 |
| −3.00 | 0 |
| −3.25 | 0 |
| −3.50 | 0 |
| −3.75 | 0 |
| −4.00 | 0 |

EFFICIENT DESIGN TO IMPLEMENT MIN/MIN- OR MAX/MAX-FUNCTIONS IN LDPC (LOW DENSITY PARITY CHECK) DECODERS

CROSS REFERENCE TO RELATED PATENTS/PATENT APPLICATIONS

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/630,360, entitled "Efficient design to implement min or max functions in LDPC (Low Density Parity Check) decoders,", filed Nov. 22, 2004, pending. pending.

CIP of Ser. No. 10/901,528

The present U.S. Utility Patent Application also claims priority pursuant to 35 U.S.C. § 120, as a continuation-in-part (CIP), to the following U.S. Utility Patent Application which is hereby incorporated herein by reference in its entirety and made part of the present U.S. Utility Patent Application for all purposes:

1. U.S. patent application Ser. No. 10/901,528, entitled "Low Density Parity Check (LDPC) code decoder using min*, min**, max* or max** and their respective inverses," filed Jul. 29, 2004, now U.S. Pat. No. 7,017,106.

Ser. No. 10/901,528 is a CON of Ser. No. 10/369,168

The U.S. patent application Ser. No. 10/901,528 claims priority pursuant to 35 U.S.C. § 120, as a continuation, to the following U.S. Utility Patent Application which is hereby incorporated herein by reference in its entirety and made part of the present U.S. Utility Patent Application for all purposes:

1. U.S. patent application Ser. No. 10/369,168, entitled "Low Density Parity Check (LDPC) code decoder using min*, min**, max* or max** and their respective inverses," filed Feb. 19, 2003, now U.S. Pat. No. 7,107,511, which claims priority pursuant to 35 U.S.C. § 119(e) to the following U.S. Provisional Patent Applications which are hereby incorporated herein by reference in their entirety and made part of the present U.S. Utility Patent Application for all purposes:
   a. U.S. Provisional Application Ser. No. 60/403,847, entitled "Inverse of min*: min*- (the inverse of max*: max*-)," filed Aug. 15, 2002.
   b. U.S. Provisional Application Ser. No. 60/408,978, entitled "Low Density Parity Check (LDPC) Code Decoder using min*, min*-, min, and/or min-," filed Sep. 6, 2002.
   c. U.S. Provisional Application Ser. No. 60/427,979, "Single stage implementation of min*, max*, min and/or max to perform state metric calculation in SISO decoder," filed Nov. 20, 2002.

BACKGROUND OF THE INVENTION

1. Technical Field of the Invention

The invention relates generally to communication systems; and, more particularly, it relates to calculations performed within decoders implemented within such communication systems.

2. Description of Related Art

Data communication systems have been under continual development for many years. One such type of communication system that has been of significant interest lately is a communication system that employs turbo codes. Another type of communication system that has also received interest is a communication system that employs Low Density Parity Check (LDPC) code. LDPC codes are oftentimes referred to in a variety of ways. For example, iterative soft decoding of LDPC codes may be implemented in a number of ways including based on the Belief Propagation (BP) algorithm, the Sum-Product (SP) algorithm, and/or the Message-Passing (MP) algorithm; the MP algorithm is sometimes referred to as a Sum Product/Belief Propagation combined algorithm. While there has been a significant amount of interest and effort directed towards these types of LDPC codes, regardless of which particular manner of iterative decoding algorithm is being employed in the specific case (3 of which are enumerated above: BP, SP, and MP), there still is ample room for improvement in the implementation and processing to be performed within a device to complete such decoding. For example, there are a variety of relatively complex and numerically burdensome calculations, data management and processing that must be performed to effectuate the accurate decoding of an LDPC coded signal.

A primary directive in these areas of development has been to try continually to lower the error floor within a communication system. The ideal goal has been to try to reach Shannon's limit in a communication channel. Shannon's limit may be viewed as being the data rate that is used in a communication channel, having a particular signal to noise ratio (SNR), that will achieve error free transmission through the channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB from the theoretical Shannon limit. While this example was achieved using an irregular LDPC code of a length of one million, it nevertheless demonstrates the very promising application of LDPC codes within communication systems.

In performing calculations when decoding a received signal, it is common for decoders to operate in the natural log (ln) domain; LDPC decoders also fall in to this category. By operating within the natural log domain, this converts all multiplications to additions, divisions to subtractions, and eliminates exponentials entirely, without affecting BER performance.

One somewhat difficult calculation is the natural log (ln) domain includes calculating the sum of exponentials as shown below:

$$\ln(e^a + e^b + e^c + \ldots)$$

This calculation can be significantly reduced in complexity using the Jacobian formula shown below:

$$\max{}^*(a,b) = \ln(e^a + e^b) = \max(a,b) + \ln(1 + e^{-|a-b|})$$

This calculation is oftentimes referred to as being a max* calculation or max* operation. It is noted that the Jacobian formula simplification of the equation shown above presents the max* operation of only two variables, a and b. This calculation may be repeated over and over when trying to calculate a longer sum of exponentials. For example, to calculate $\ln(e^a + e^b + e^c)$, the following two max* operations may be performed:

$$\max{}^*(a,b) = \ln(e^a + e^b) = \max(a,b) + \ln(1 + e^{-|a-b|}) = x$$

$$\max{}^*(a,b,c) = \max{}^*(x,c) = \ln(e^x + e^c) = \max(x,c) + \ln(1 + e^{-|x-c|})$$

While there has a been a great deal of development within the context of LDPC code, the extensive processing and computations required to perform decoding therein can be extremely burdensome—this one example above of the calculating the sum of exponentials illustrates the potentially complex and burdensome calculations needed when performing decoding. Sometimes the processing requirements are so burdensome that they simply prohibit their implementation within systems having very tight design budgets.

There have been some non-optimal approaches to deal with the burdensome calculations required to do such burdensome calculations. For example, in performing this basic max* operation, some decoders simply exclude the logarithmic correction factor of $\ln(1+e^{-|a-b|})$ altogether and use only the max(a,b) result which may be implemented within a single instruction within a digital signal processor (DSP). However, this will inherently introduce some degradation in decoder performance. Most of the common approaches that seek to provide some computational improvements either cut corners in terms of computational accuracy, or they do not provide a sufficient reduction in computational complexity to justify their integration. One of the prohibiting factors concerning the implementation of many LDPC codes is oftentimes the inherent computational complexity coupled with the significant amount of memory required therein.

Other types of comparably complex calculations that may sometimes be employed when decoding coded signals includes the min (min-double-star) operation and the max (max-double-star) operation. The prior art means by which min processing and max processing are performed are less than ideal and would benefit greatly from some more efficient designs and implementations.

Many of these calculations performed when decoding such coded signals are relatively complex. Because of this, many prior art approaches to design hardware to perform these complex calculations are also very complex. Moreover, many designers implement non-exact hardware solutions to make these calculations (e.g., approximations of the actual calculations needed to decode such signals).

FIG. 6A is a diagram illustrating a prior art embodiment of min (min-double-star) processing 601. This diagram shows one possible prior art approach by which min processing may be implemented. This functional block operates on two input values, shown as A and B. The difference between the two values, A−B, and the sum of the two values, A+B, are both calculated. The two values, A and B, are also provided to a MUX (Multiplexor) 610, whose selection signal determines the output as being A or B based on the sign bit of the difference between the two values, A−B. For example, only one of A or B is output from the MUX 610. If A is less than B, then the sign bit of the difference between the two values, A−B, is 0, and if A is greater than B, hen the sign bit of the difference between the two values, A−B, is 1.

Therefore, the MUX 610 is implemented such that when A is greater than B, then the sign bit of the difference between the two values, A−B, selects B as being output from the MUX 610. In other words, B is then the minimum of two input values, i.e. min(A,B)=B. Analogously, the MUX 610 is also implemented such that when A is less than B, then the sign bit of the difference between the two values, A−B, selects A as being output from the MUX 610. In other words, A is then the minimum of two input values, i.e. min(A,B)=A.

Also, the difference between the two values, A−B, and the sum of the two values, A+B, are each provided to a first log correction functional block 620 and a second log correction functional block 630, respectively. The difference between the two values, A−B, is used by the first log correction functional block 620 to determine a first log correction factor, $-\ln(1+e^{-|A-B|})$. This first log correction factor includes an absolute value function of the difference between the two values, A−B. Analogously, the sum of the two values, A+B, is used by the second log correction functional block 630 to determine a second log correction factor, $\ln(1+e^{-(A+B)})$. This second log correction factor does not include an absolute value function of the sum of the two values, A+B.

The min** processing resultant is composed of the sum of the first log correction factor, $-\ln(1+e^{-|A-B|})$, the second log correction factor, $\ln(1+e^{-(A+B)})$, and the minimum of two input values, i.e. min(A,B)=A or B. Mathematically, this may be shown as follows:

$$\min^{**}(A,B)=\min(A,B)-\ln(1+e^{-|A-B|})+\ln(1+e^{-(A+B)})$$

FIG. 6B is a diagram illustrating a table of possible log correction factors 602 that may be employed using the prior art embodiment of min** processing of FIG. 6A. Sometimes, various means may be employed to pre-calculate (e.g., to predetermine) a range of possible values for these log correction factors. This table shows a range of possible values for the second log correction factor, $\ln(1+e^{-(A+B)})$, as a function of sum of the two values, A+B. As can clearly be seen, the possible values of the second log correction factor, $\ln(1+e^{-(A+B)})$, continue to increase as the sum of the two values, A+B, continues to decrease. To store a large number of possible values of the second log correction factor, $\ln(1+e^{-(A+B)})$, for a wide variety of different possible values of the sum of the two values, A+B, would inherently require a relatively large amount of memory. The larger the memory device being employed to store a relatively broad range of possible values of the second log correction factor, $\ln(1+e^{-(A+B)})$, then a larger surface area will be consumed within an actual device that is implemented to perform such calculations and the greater the cost of such an actual device.

There still exists a need in the art to provide for more efficient solutions when making calculations, such as min (min-double-star) and max (max-double-star), within decoders that operate within the logarithmic domain.

The use of LDPC coded signals continues to be explored within many newer application areas. One such application area is that digital video broadcasting. The Digital Video Broadcasting Project (DVB) is an industry-led consortium of over 260 broadcasters, manufacturers, network operators, software developers, regulatory bodies and others in over 35 countries committed to designing global standards for the global delivery of digital television and data services. Publicly available information concerning the DVB is available at the publicly available Internet site of the DVB.

The DVB-S2 (i.e., DVB-Satellite Version 2) draft standard is also publicly available at the Internet site of the DVB.

Greater detail regarding the types of signals employed within such DVB-S2 compliant systems is included within this DVB-S2 standard. The DVB-S2 standard focuses primarily on the transmission system description and the subsystems therein including mode adaptation, stream adaptation, FEC encoding (including both BCH outer encoding and LDPC inner encoding), bit mapping into constellation, physical layer framing, and baseband shaping and quadrature modulation.

The DVB-S2 is an advanced version of DVB-S (the first standard produced by the Digital Video Broadcasting Project). DVB-S2 seeks to provide for greater efficiency than DVB-S. DVB-S2 plans to implement 4 different modulation types: QPSK (Quadrature Phase Shift Key), 8 PSK (Phase Shift Key), 16 APSK (Asymmetric Phase Shift Keying), and 32 APSK. Generally speaking, the QPSK and 8 PSK modulation types are intended for broadcast applications through non-linear satellite transponders driven near to saturation; the 16 APSK and 32 APSK modulation types are geared more primarily towards professional applications requiring semi-linear transponders. The 16 APSK and 32 APSK modulation types operate by trading off power efficiency for greater throughput.

In addition, DVB-S2 uses a powerful FEC (Forward Error Correction) system based on concatenation of BCH (Bose-Chaudhuri-Hocquenghem) outer coding with LDPC inner coding. The result is performance which is at times only 0.7 dB from the Shannon limit. The choice of FEC parameters depends on the system requirements. With VCM (Variable Coding and Modulation) and ACM (Adaptive Coding and Modulation), the code rates can be changed dynamically, on a frame by frame basis.

The multiple operational parameters to which a receiving device, that includes a decoder, must operate to be DVB-S2 compliant is very clearly laid out by the operational parameters of the transmission system description. However, as long as a receiving device, that includes a decoder, complies with these operational parameters specified within the DVB-S2 standard, great latitude in the means of implementation is permissible. The generation of signals on the transmission end of a communication channel is clearly laid out within the DVB-S2 standard, and the means by which the receive processing of such signal (at the receiving end of a communication channel) may be performed is widely open to the designer. Clearly, a key design constrain of such receiving devices is to provide for the accommodation of such DVB-S2 signals while providing for very high performance while occupying a relatively small amount of area and having a relatively lower level of complexity.

Another application area in which the use of LDPC coded signals continues to be explored is in various communication system embodiments and application areas whose operation is specified and governed by the IEEE (Institute of Electrical & Electronics Engineers). For example, the use of LDPC coded signals has been of significant concern within the IEEE P802.3an (10 GBASE-T) Task Force. This IEEE P802.3an (10 GBASE-T) Task Force has been created by the IEEE to develop and standardize a copper 10 Giga-bit Ethernet standard that operates over twisted pair cabling according to the IEEE 802.3 CSMA/CD Ethernet protocols. Carrier Sense Multiple Access/Collision Detect (CSMA/CD) is the protocol for carrier transmission access in Ethernet networks. IEEE 802.3an (10 GBASE-T) is an emerging standard for 10 Gbps Ethernet operation over 4 wire twisted pair cables. More public information is available concerning the IEEE P802.3an (10 GBASE-T) Task Force at the publicly available Internet sites of the working groups of the IEEE.

This high data rate provided in such applications is relatively close to the theoretical maximum rate possible over the worst case 100 meter cable. Near-capacity achieving error correction codes are required to enable 10 Gbps operation. The latency constraints, which would be involved by using traditional concatenated codes, simply preclude their use in such applications.

Typical encoding and modulation of LDPC coded signals is performed by generating a signal that includes symbols each having a common code rate and being mapped to a singular modulation (e.g., a singular constellation shape having a singular mapping of the constellation points included therein). That is to say, all of the symbols of such an LDPC coded modulation signal have the same code rate and the same modulation (the same constellation shape whose constellation points have the singular mapping). Oftentimes, such prior art designs are implemented as to maximize the hardware and processing efficiencies of the particular design employed to generate the LDPC coded signal having the single code rate and single modulation for all of the symbols generated therein.

However, in some more recent prior art LDPC communication systems, the design of LDPC encoders has sought to provide for capabilities to generate multiple types of LDPC coded signals. Within these communication systems, the code rate and modulation type for all of the symbols within any given LDPC block is the same. That is to say, the entire block has a particular code rate and modulation type associated with it. Nevertheless, the encoder is operable to generate different LDPC blocks such that a first LDPC block has a first code rate and first modulation type associated with it, and a second LDPC block has a second code rate and second modulation type associated with it.

A decoder that operates to decode such signals must be able to accommodate the various LDPC block types that it may receive. Currently, the LDPC decoder designs being discussed in the art require a relatively large amount of area and are of a relatively high complexity. There is a need in the art to provide for an LDPC decoder that can accommodate such signals while providing for very high performance, less area, and less complexity.

Generally speaking, there is a seemingly continual in the art to provide for means by which the calculations and processing to be performed within decoders that are operable to decode coded signals. This is true with respect to virtually any type of coded signals, including turbo coded signals, TTCM (Turbo Trellis Coded Modulation) signals, LDPC coded signals, and other types of coded signals. Improvements in the hardware and functional blocks employed to perform the various calculations required therein could benefit the efficiency of the decoding processing implemented within many decoders.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 9A is a diagram illustrating an embodiment of min processing performed in cooperation with min− (min-double-star-minus) processing in accordance with certain aspects of the invention.

FIG. 9B is a diagram illustrating an embodiment of max (max-double-star) processing performed in cooperation with max− (max-double-star-minus) processing in accordance with certain aspects of the invention.

FIG. 14A is a diagram illustrating a bounded table of possible log correction factors, as a function of an absolute value of a difference between two values, that may be employed using the various embodiments of min or max processing that may be constructed in accordance with certain aspects of the invention.

FIG. 14B is a diagram illustrating a bounded table of possible log correction factors, as a function of an absolute value of a sum of two values, that may be employed using the various embodiments of min or max processing that may be constructed in accordance with certain aspects of the invention.

DETAILED DESCRIPTION OF THE INVENTION

Within various types of communication systems, decoding processing of received signals can often involve very complex calculations due to the very nature of the coding types involved (e.g., LDPC (Low Density Parity Check), turbo code, TTCM (Turbo Trellis Coded Modulation), among other coding types). Because of this complexity, the decoding processing within many of these decoders is oftentimes performed in the logarithmic domain where multiplications may be executed as additions and divisions may be executed as subtractions.

Some possible embodiments by which a decoder may be implemented are depicted herein. In performing this decoding processing, there is often a means by which a minimum (or maximum) of two values is to be determined along with some logarithmic correction factor. The log correction factor arises because the calculations are implemented in the logarithmic, domain, in that, multiplications may be reduced to additions and divisions may be reduced to subtractions. In doing these calculations, many attempts are made to perform such calculations quicker and easier (e.g., making certain approximations). However, some of the approaches that have been made do not provide very good performance. There seems always to be room in the art for improvements by which such calculations and/or approximations may be made while providing for improved performance.

A novel approach for performing some computationally intensive calculations employed when decoding various coded signals is presented. The functional blocks presented herein may be adapted and applied within a variety of types of decoders including those that perform decoding of turbo coded signals, TTCM (Turbo Trellis Coded Modulation) signals, LDPC (Low Density Parity Check) coded signals, and other types of coded signals as well without departing from the scope and spirit of the invention. That is to say, the processing performed by the various functional blocks presented herein may perform calculations within a variety of decoders including LDPC decoders, turbo decoders, TTCM decoders, and/or other decoder types without departing from the scope and spirit of the invention.

Several embodiments are presented herein with particular application to assist in the calculations and processing required to perform decoding of LDPC coded signals, but the efficient principles and architectures of the various functional blocks presented herein may also be applied to and implemented within other types of communication devices that perform decoding and processing of other types of coded signals as well.

It is also noted that the calculations of the various functional blocks presented herein may be implemented within the logarithmic domain (e.g., where multiplications can be implemented as additions and divisions can be implemented as subtractions).

Figure 1:
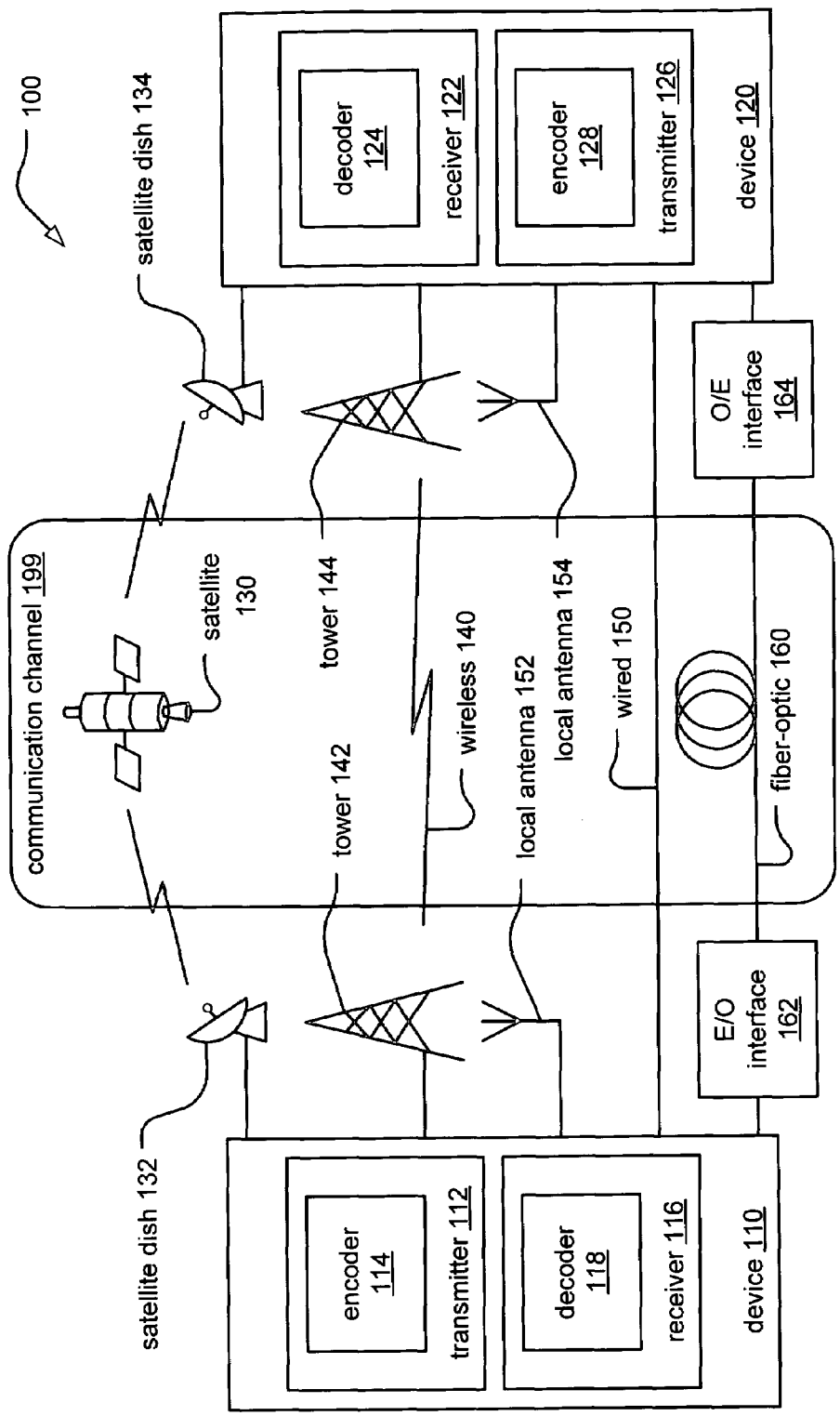
FIG. 1 and FIG. 2 are diagrams illustrating various embodiments of communication systems that may be built in accordance with certain aspects of the invention.
Figure 2:
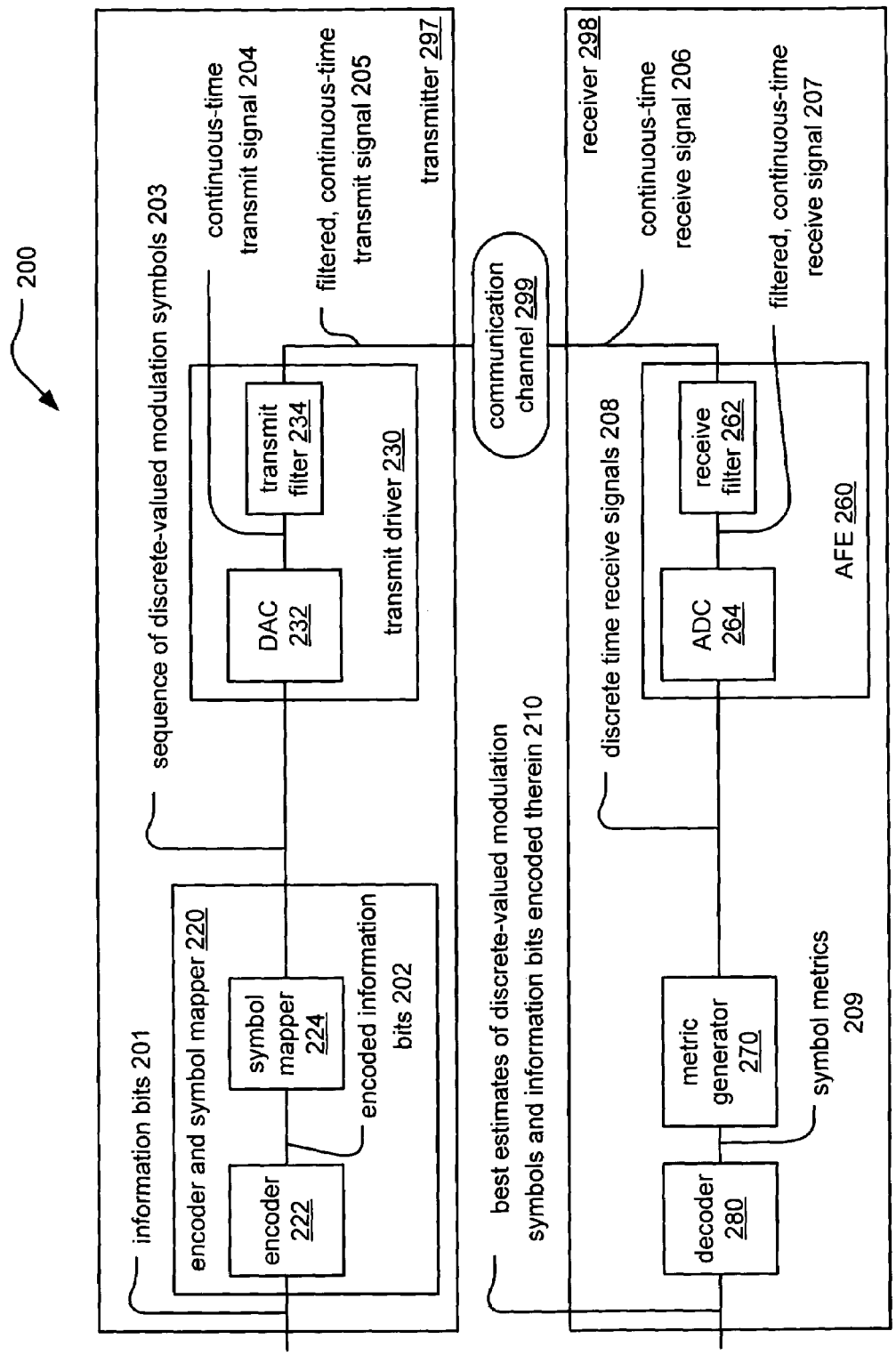

FIG. 1 and FIG. 2 are diagrams illustrating various embodiments of communication systems, 100 and 200, respectively, that may be built in accordance with certain aspects of the invention.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects of the invention therein. In addition, several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signal. Before more details are provided below, a general description of LDPC codes is provided.

Figure 3:
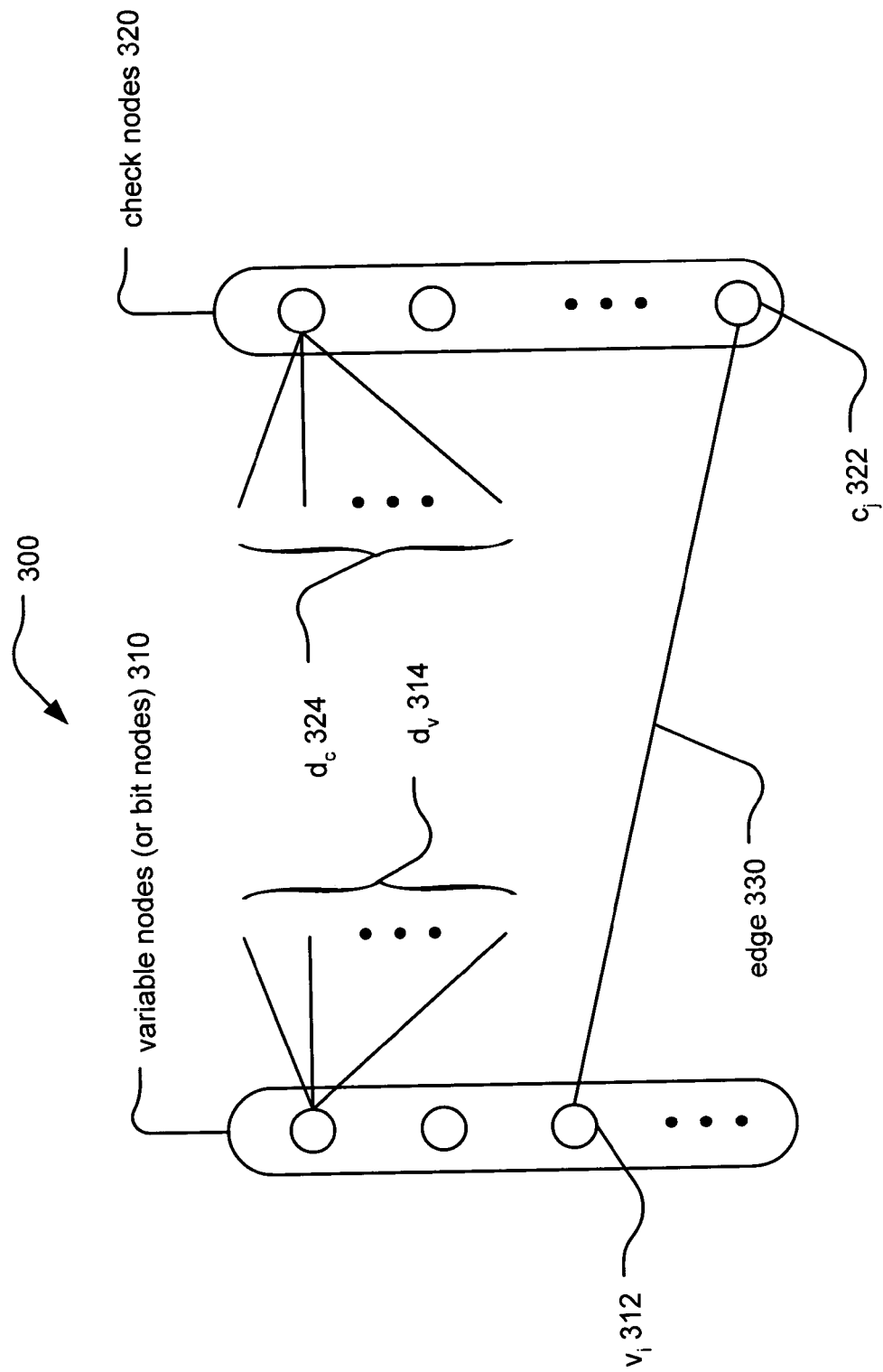
FIG. 3 is a diagram illustrating an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also be referred to as a Tanner graph. An LDPC code may be, viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(j)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: *MIT Press*, 1963.

[2] M. G. Luby, M. Mitzenmacher, M. A. Shokrollahi, D. A. Spielman, and V. Stemann, "Practical loss-resilient codes," *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j), the nodes of the edge may alternatively be denoted as by e=(v(e), c(e)) (or e=(b(e), c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $E_c(j)=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i.

Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects of the invention are also operable to accommodate both regular LDPC codes and irregular LDPC codes.

The LLR (Log-Likelihood Ratio) decoding approach of LDPC codes may be described generally as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code's parity check matrix that is used to check the parity of the received vector. The LLR is the logarithm of the ratio of these two calculated probabilities. This LLR gives a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, within the sent signal having the form of $((-1)^{v_{0i}}, \ldots, (-1)^{v_{N-1}})$, then the metrics of the channel may be defined as $p(y_i|v_i=0)$, $p(y_i|v_i=1)$, $i=0, \ldots, N-1$. The LLR of a metric, $L_{metric}(i)$, will then be defined as follows:

$$L_{metric}(i) = \ln \frac{p(y_i \mid v_i = 0)}{p(y_i \mid v_i = 1)}$$

It is noted than "ln," as depicted herein within various mathematical expressions, refers to the natural logarithm having base e.

For every variable node $v_i$, its LLR information value will then be defined as follows:

$$\ln \frac{p(v_i = 0 \mid y_i)}{p(v_i = 1 \mid y_i)} = L_{metric}(i) + \ln \frac{p(v_i = 0)}{p(v_i = 1)}$$

Since the variable node, $v_i$, is in an LDPC codeword, then the value of the ratio of these values, $$\ln \frac{p(v_i = 0)}{p(v_i = 1)},$$

may be replaced by the following $$\ln \frac{p(v_i = 0, vH^T = 0 \mid y)}{p(v_i = 1, vH^T = 0 \mid y)} = \sum_{(i,j) \in E_v(i)} \ln \frac{p(v_i = 0, vh_j^T = 0 \mid y)}{p(v_i = 1, vh_j^T = 0 \mid y)}$$

where $E_v(i)$ is a set of edges starting with $v_i$ as defined above.

When performing the BP (Belief Propagation) decoding approach in this context, then the value of $$\ln \frac{p(v_i = 0, vh_j^T = 0 \mid y)}{p(v_i = 1, vh_j^T = 0 \mid y)}$$

may be replaced by the following relationship $$L_{check}(i, j) = \ln \frac{p\left(\sum_{e \in E_c(j)\setminus\{(i,j)\}} v_{v(e)} = 0 \mid y\right)}{p\left(\sum_{e \in E_c(j)\setminus\{(i,j)\}} v_{v(e)} = 1 \mid y\right)}.$$

$L_{check}(i, j)$ is called the EXT (extrinsic) information of the check node $c_j$ with respect to the edge $(i, j)$. In addition, it is noted that $e \in E_c(j)\setminus\{(i, j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual info bit values within a received vector. Also in a BP approach, then the extrinsic information of the variable node $v_i$ with respect to the edge $(i, j)$ may be defined as follows:

$$L_{var}(i, j) = L_{metric}(i) + \sum_{(i,k) \in E_v(i)\setminus\{(i,j)\}} L_{check}(i, k).$$

Figure 4:
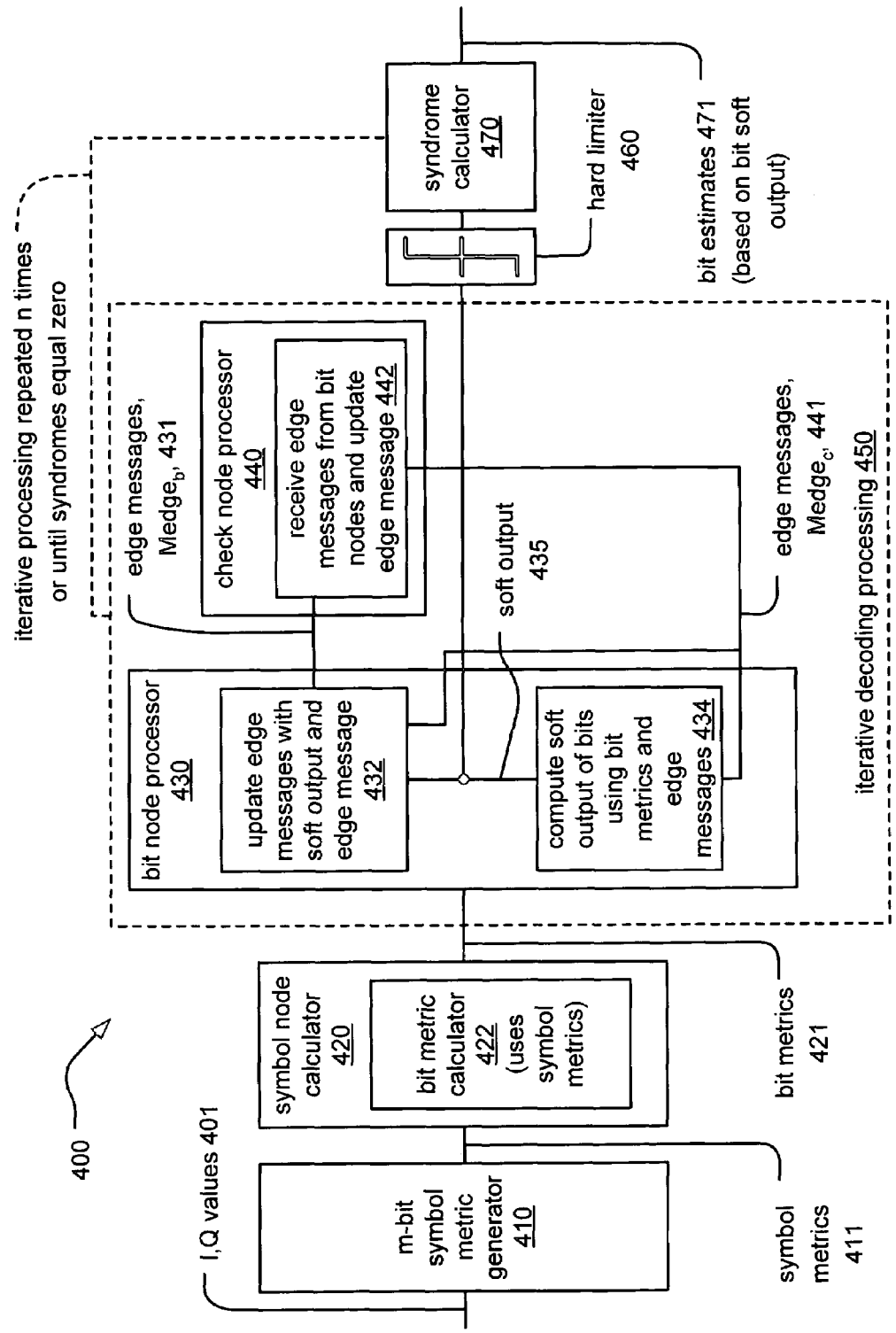
FIG. 4 is a diagram illustrating an embodiment of LDPC (Low Density Parity Check) decoding functionality using bit metric according to certain aspects of the invention.

FIG. 4 is a diagram illustrating an embodiment of LDPC (Low Density Parity Check) decoding functionality using bit metric 400 according to certain aspects of the invention. To perform decoding of an LDPC coded signal having an m-bit signal sequence, the functionality of this diagram may be employed. After receiving the I, Q (In-phase, Quadrature) values 401 of a signal at the symbol nodes, an m-bit symbol metric generator 410 calculates the corresponding symbol metrics 411. At the symbol nodes, these symbol metrics 411 are then passed to a symbol node calculator functional block 420 that uses these received symbol metrics 411 to calculate the bit metrics 421 corresponding to those symbols. These bit metrics 421 are then passed to the bit nodes connected to the symbol nodes according to the LDPC code bipartite graph by which the LDPC coded signal has been generated and by which it is to be decoded.

Thereafter, at the bit nodes, a bit node processor 430 operates to compute the corresponding soft messages of the bits. Then, in accordance with iterative decoding processing 450, the bit node processor 430 receives the edge messages with respect to the check nodes, Medge$_c$ 441, from a check node processor 440 and updates the edge messages with respect to the bit nodes, Medge$_b$ 431, with the bit metrics 421 received from the symbol node calculator functional block 420. These edge messages with respect to the bit nodes, Medge$_b$ 431, after being updated, are then passed to the check node processor 440.

At the check nodes, the check node processor 440, then receives these edge messages with respect to the bit nodes, Medge$_b$ 431, (from the bit node processor 430) and updates the them accordingly thereby generating the next updated version of edge messages with respect to the check nodes, Medge$_c$ 441; this is shown in functional block 442. These updated edge messages with respect to the check nodes, Medge$_c$ 441, are then passed back to the bit nodes (e.g., to the bit node processor 430) where the soft output of the bits is calculated using the bit metrics 421 and the current iteration values of the edge messages with respect to the bit nodes, Medge$_b$ 431; this is shown in functional block 434. Thereafter, using this just calculated soft output of the bits (shown as the soft output 435), the bit node processor 430 updates the edge messages with respect to the bit nodes, Medge$_b$ 431, using the previous values of the edge messages with respect to the bit nodes, Medge$_b$ 431 (from the just previous iteration) and the just calculated soft output 435; this is shown in functional block 432. The iterative decoding processing 450 continues between the bit nodes and the check nodes (i.e., between the bit node processor 450 and the check node processor 440) according to the LDPC code bipartite graph that was employed to encode and generate the signal that is being decoded.

These iterative decoding processing steps, performed by the bit node processor 430 and the check node processor 440, are repeated a predetermined number of iterations (e.g., repeated n times, where n is selectable). Alternatively, these iterative decoding processing steps are repeated until the syndromes of the LDPC code are all equal to zero.

The soft output 435 is generated within the bit node processor 430 during each of the decoding iterations. In this embodiment, this soft output 435 may be provided to a hard limiter 460 where hard decisions may be made, and that hard decision information may be provided to a syndrome calculator 470 to determine whether the syndromes of the LDPC code are all equal to zero. When the syndromes are not equal to zero, the iterative decoding processing 450 continues again by appropriately updating and passing the edge messages between the bit node processor 430 and the check node processor 440. For example, the edge messages with respect to the bit nodes, Medge$_b$ 431, are passed to the check node processor 440 from the bit node processor 430. Analogously, the edge messages with respect to the check nodes, $Medge_c$ 441, are passed to the bit node processor 430 from the check node processor 440 from. In some embodiments, the soft output 435 and the syndrome calculation performed by the syndrome calculator 470 are both performed during every decoding iteration.

After all of these steps of the iterative decoding processing 450 have been performed, then the best estimates of the bits (shown as bit estimates 471) are output based on the bit soft output. In the approach of this embodiment, the bit metric values that are calculated by the symbol node calculator functional block 420 are fixed values and used repeatedly in updating the bit node values.

Figure 5:
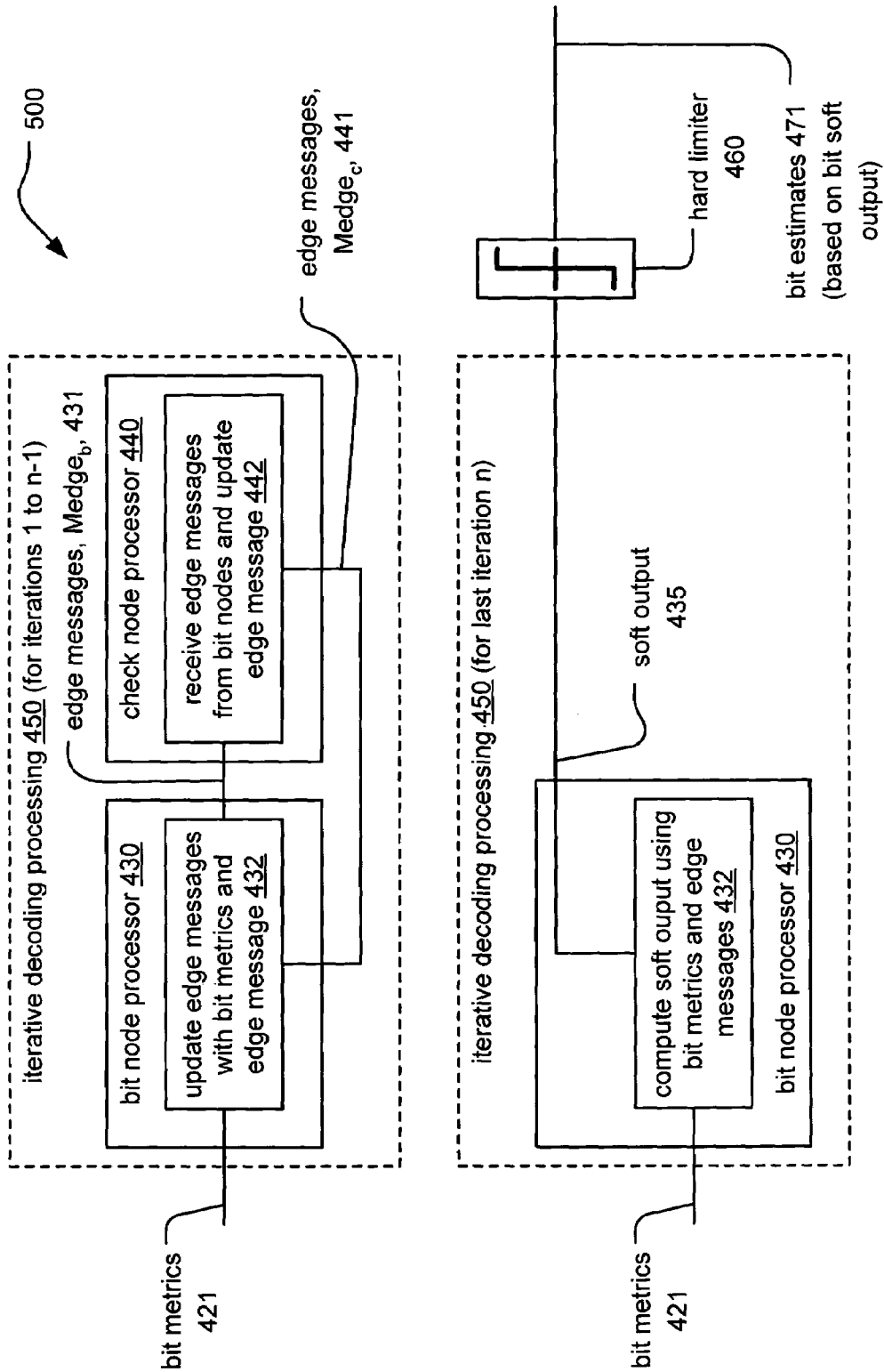
FIG. 5 is a diagram illustrating an alternative embodiment of LDPC decoding functionality using bit metric according to certain aspects of the invention (when performing n number of iterations).

FIG. 5 is a diagram illustrating an alternative embodiment of LDPC decoding functionality using bit metric 500 according to certain aspects of the invention (when performing n number of iterations). This embodiment shows how the iterative decoding processing 450 of the FIG. 4 may be performed when a predetermined number of decoding iterations, shown as n, is performed. If the number of decoding iterations is known beforehand, as in a predetermined number of decoding iterations embodiment, then the bit node processor 430 may perform the updating of its corresponding edge messages with respect to the bit nodes, $Medge_b$ 431, using the bit metrics 421 themselves (and not the soft output 435 as shown in the previous embodiment and described above). This processing may be performed in all but the last decoding iteration (e.g., for iterations 1 through n−1). However, during the last iteration, the bit node processor 430 calculates the soft output 435. The soft output 435 is then provided to the hard limiter 460 where hard decisions may be made of the bits. The syndromes need not be calculated in this embodiment since only a predetermined number of decoding iterations are being performed.

Oftentimes, when implementing LDPC decoding functionality into actual communication devices and hardware, a critical design consideration is how to implement the hardware so that the calculations may be performed as quickly as possible and also with the highest degree of accuracy as possible. Also, hardware implementations of such LDPC decoding functionality can be implemented within the logarithmic domain (or "log domain" for short). In doing this, the hardware implementations can sometimes be simplified, in that, the multiplication processes may be reduced to additions, and the division processes may be reduced to subtractions. Oftentimes, the difficulty in implementing the calculations necessary to perform the LDPC decoding processing lie in the difficult to implement the calculations necessary to perform check node processing. For example, the calculations performed within a check node processor (or bit-check processor that is performing check node processing) often require the determination of a minimum (or maximum) value from among a number of possible values. When these calculations are performed in actual hardware whose calculations are implemented in the log domain, this often involves determining this minimum (or maximum) value at the cost of some precision. That is to say, without employing some log correction factor within the calculations, then a loss of precision may be incurred. Even when implemented in the log domain, some prior art decoding approaches only select a minimum (or maximum) value from among a number of possible values without employing any log correction factor. This inherently introduced some imprecision when selecting a minimum (or maximum) value from among a number of possible values when operating in the log domain.

Several of these calculations are presented below with respect to operating on an input value "x" and an input value "y." These input values may be viewed as being different edge messages with respect to the bit nodes, $Medge_b$. For example, the input value "x" may be viewed as being a first edge message with respect to the bit nodes, $Medge_b(1)$, and the input value "y" may be viewed as being a second edge message with respect to the bit nodes, $Medge_b(2)$, or vice versa. The check node processing of these edge messages with respect to the bit nodes, $Medge_b$, using any of the various possible embodiments presented herein, is employed to generate the corresponding updated edge messages with respect to the check nodes, $Medge_c$.

The inventors have developed a number of means by which these calculations may be performed while still maintaining a high degree of accuracy when performing check node processing. These calculations include min (min-double-star) processing, min− (min-double-star-minus) processing. In addition, there is a corresponding maximum related function: max (max-double-star) processing, max− (max-double-star-minus) processing.

Several of these possible calculations are presented below with respect to operating on an input value "x" and an input value "y."

min processing and min− processing:

$$\min{}^{**}(x,y) = \min(x,y) - \ln(1+\exp(-|x-y|)) + \ln(1+\exp(-(x+y)))$$

$$\min{}^{**}-(x,y) = \min(x,y) - \ln(1-\exp(-|x-y|)) + \ln(1-\exp(-(x+y)))$$

max processing and max− processing:

$$\max{}^{**}(x,y) = \max(x,y) + \ln(1+\exp(-|x-y|)) - \ln(1+\exp(-(x+y)))$$

$$\max{}^{**}-(x,y) = \max(x,y) + \ln(1-\exp(-|x-y|)) - \ln(1+\exp(-(x+y)))$$

Now that a description of some of the various communication systems in which certain aspects of the invention may be found have been as well as some of the possible embodiments by which decoding of LDPC coded signals may be performed have been presented, the reader is directed back to the "DESCRIPTION OF RELATED ART" section. The "DESCRIPTION OF RELATED ART" section above provides some description of prior art approaches by which min** processing may be performed. An example of such one such prior art embodiment is described with respect to the FIG. 6A and the FIG. 6B.

The min** processing operation is provided as follows:

$$\min{}^{**}(A,B) = \ln\left(\frac{1+e^{(A+B)}}{e^A + e^B}\right) \quad \text{(EQ 1A)}$$

$$\min{}^{**}(A,B) = \min(A,B) - \ln(1+e^{-|A-B|}) + \ln(1+e^{-(A+B)}) \quad \text{(EQ 1B)}$$

As also presented above, this min** processing resultant may be viewed as being composed of the sum of a first log correction factor, $-\ln(1+e^{-|A-B|})$, a second log correction factor, $\ln(1+e^{-(A+B)})$, and the minimum of two input values, i.e. min(A,B)=A or B.

Upon closer inspection, it is noted that this second log correction factor, $\ln(1+e^{-(A+B)})$, may be broken down further into two possible values, depending on whether the sum of the two values, A+B, is greater than or equal to zero or less than zero.

$$\ln(1+e^{-(A+B)}) = \begin{cases} \ln(1+e^{-|A+B|}) & \text{for } A+B \geq 0 \\ -(A+B)+\ln(1+e^{-|A+B|}) & \text{for } A+B < 0 \end{cases} \quad \text{(EQ 2)}$$

It is also noted that these (EQ 1A and EQ 1B) and (EQ 2) may be combined to generate four possible min processing resultants, depending on whether the sum of the two values, A+B, is positive or negative, and also depending on whether the difference between the two values, A−B, is positive or negative. In other words, the sum of the two values, A+B, may be calculated, and the sum of the two values, A+B, may be calculated, and the sign bits of the sum and the difference may be used to select which of the four possible min processing resultants is the proper resultant based on the input values A and B. The four possible min** processing resultants are presented as follows:

$$\min{}^{**}(A,B) = \qquad\qquad\qquad\qquad\qquad\text{(EQ 3)}$$
$$\begin{cases} -B - \ln(1+e^{-|A-B|}) + \ln(1+e^{-|A+B|}) & A-B < 0, A+B < 0 \\ -A - \ln(1+e^{-|A-B|}) + \ln(1+e^{-|A+B|}) & A-B > 0, A+B < 0 \\ A - \ln(1+e^{-|A-B|}) + \ln(1+e^{-|A+B|}) & A-B < 0, A+B > 0 \\ B - \ln(1+e^{-|A-B|}) + \ln(1+e^{-|A+B|}) & A-B > 0, A+B > 0 \end{cases} \text{for}$$

It is noted here that the only difference among these 4 possible min processing resultants is the first term, i.e., either −B, −A, A or B. The remaining terms of each of the 4 possible min processing resultants is the same.

This representation of the min** processing resultant includes a first log correction factor, $-\ln(1+e^{-|A-B|})$, that is based on an absolute value of the difference between the first value and the second value, i.e. based on |A−B|.

This representation of the min processing resultant also includes a second log correction factor, $\ln(1+e^{-|A+B|})$, that is based on an absolute value of the sum of the first value and the second value, i.e. based on |A+B|. This is a departure from the prior art approaches to determine various min processing resultants, in that, each of the first log correction factor, $-\ln(1+e^{-|A-B|})$ and the second log correction factor, $\ln(1+e^{-|A+B|})$, are based on functions that employ absolute value functions of the input values. Specifically, this involves the absolute value of the difference between the first value and the second value, i.e. |A−B|, and the absolute value of the sum of the first value and the second value, i.e. based on |A+B|.

In addition, given that there are four possible values for the min processing resultants, the selection of which of these min processing resultants is the proper one employs a selection scheme that may select from among 4 possible values.

Furthermore, the min** processing resultant may alternatively be represented as follows:

$$\min{}^{**}(A,B) = \min(A,B) - \ln(1+e^{-|A-B|}) + \ln(1+e^{-|A+B|})$$

$$\min{}^{**}(A,B) = \min(A,B) + \log M + \log P \qquad \text{(EQ 4)}$$

In other words, the first log correction factor, $-\ln(1+e^{-|A-B|})$, may be represented as, log M. Also, the second log correction factor, $\ln(1+e^{-|A+B|})$, may be represented as, log P. This convention is employed in some of the diagrams. This nomenclature may be easily remembered, in that, the first log correction factor, $-\ln(1+e^{-|A-B|})$, which may be represented as, log M, is a "minus" function of the two values, i.e., a function of A−B. Analogously, the second log correction factor, $\ln(1+e^{-|A+B|})$, which may be represented as, log P, is a "plus" function of the two values, i.e., a function of A+B.

A description of some of the aspects of the min processing is provided above. The analogous and related min− processing is presented below.

The min**− processing operation is provided as follows:

$$\min{}^{**}-(A,B) = \ln\left(\frac{e^{-(A+B)}}{e^{-B}-e^{-A}}\right) \qquad \text{(EQ 5A)}$$

$$\min{}^{**}-(A,B) = \min(A,B) - \ln(1-e^{-|A-B|}) + \ln(|1-e^{-(A+B)}|) \quad \text{(EQ 5B)}$$

As also presented above, this min**− processing resultant may be viewed as being composed of the sum of a first log correction factor, $-\ln(1-e^{-|A-B|})$, a second log correction factor, $\ln(|1-e^{-(A+B)}|)$, and the minimum of two input values, i.e. min(A,B)=A or B.

Upon closer inspection, it is noted that this second log correction factor, $\ln(|1-e^{-(A+B)}|)$, may be broken down further into two possible values, depending on whether the sum of the two values, A+B, is greater than or equal to zero or less than zero.

$$\ln(|1-e^{-(A+B)}|) = \begin{cases} \ln(1-e^{-|A+B|}) & \text{for } A+B \geq 0 \\ -(A+B)+\ln(1-e^{-|A+B|}) & \text{for } A+B < 0 \end{cases} \quad \text{(EQ 6)}$$

By implementing this term, $\ln(|1-e^{-(A+B)}|)$, by using the log correction factor, $\ln(1-e^{-|A+B|})$, a table having bounded entries may be realized. While the bounding of entries of a table storing values for min− processing may not be quite as tight and the bounding of entries of a table storing values for min processing, it is nevertheless bounded and provides all of the benefits of smaller number of entries to be stored, smaller device size, and other benefits provided when storing a number of values that is bounded to a particular region. The bounding of this region, for these values of interest of A−B and A+B, is between approximately −2.25 and −0.25.

It is also noted that these (EQ 5A and EQ 5B) and (EQ 6) may be combined to generate four possible min− processing resultants, depending on whether the sum of the two values, A+B, is positive or negative, and also depending on whether the difference between the two values, A−B, is positive or negative. In other words, the sum of the two values, A+B, may be calculated, and the sum of the two values, A+B, may be calculated, and the sign bits of the sum and the difference may be used to select which of the four possible min− processing resultants is the proper resultant based on the input values A and B. The four possible min**− processing resultants are presented as follows:

$$\min{}^{**}-(A,B) = \qquad\qquad\qquad\qquad\qquad\text{(EQ 7)}$$
$$\begin{cases} -B - \ln(1-e^{-|A-B|}) + \ln(1-e^{-|A+B|}) & A-B < 0, A+B < 0 \\ -A - \ln(1-e^{-|A-B|}) + \ln(1-e^{-|A+B|}) & A-B > 0, A+B < 0 \\ A - \ln(1-e^{-|A-B|}) + \ln(1-e^{-|A+B|}) & A-B < 0, A+B > 0 \\ B - \ln(1-e^{-|A-B|}) + \ln(1-e^{-|A+B|}) & A-B > 0, A+B > 0 \end{cases} \text{for}$$

It is noted here that the only difference among these 4 possible min− processing resultants is the first term, i.e., either −B, −A, A or B. The remaining terms of each of the 4 possible min− processing resultants is the same.

This representation of the min**- processing resultant includes a first log correction factor, $-\ln(1-e^{-|A-B|})$, that is based on an absolute value of the difference between the first value and the second value, i.e. based on $|A-B|$.

This representation of the min- processing resultant also includes a second log correction factor, $\ln(1-e^{-|A+B|})$, that is based on an absolute value of the sum of the first value and the second value, i.e. based on $|A+B|$. This is a departure from the prior art approaches to determine various min processing resultants, in that, each of the first log correction factor, $-\ln(1-e^{-|A-B|})$, and the second log correction factor, $\ln(1-e^{-|A+B|})$, are based on functions that employ absolute value functions of the input values. Specifically, this involves the absolute value of the difference between the first value and the second value, i.e. $|A-B|$, and the absolute value of the sum of the first value and the second value, i.e. based on $|A+B|$.

In addition, given that there are four possible values for the min- processing resultants, the selection of which of these min- processing resultants is the proper one employs a selection scheme that may select from among 4 possible values.

Furthermore, the min**- processing resultant may alternatively be represented as follows:

$$\text{min}^{**}\text{-}(A,B)=\min(A,B)-\ln(1-e^{-|A-B|})+\ln(1-e^{-|A+B|})$$

$$\text{min}^{**}\text{-}(A,B)=\min(A,B)+\log M+\log P \quad (EQ\ 8)$$

In other words, the first log correction factor, $-\ln(1-e^{-|A-B|})$, may be represented as, log M. Also, the second log correction factor, $\ln(1-e^{-|A+B|})$, may be represented as, log P. This nomenclature may be easily remembered, in that, the first log correction factor, $-\ln(1-e^{-|A-B|})$, which may be represented as, log M, is a "minus" function of the two values, i.e., a function of A−B. Analogously, the second log correction factor, $\ln(1-e^{-|A+B|})$, which may be represented as, log P, is a "plus" function of the two values, i.e., a function of A+B.

In the following diagrams, means for hardware implementation are provided that perform certain of the exact calculations needed to decode such signals. These approaches do not perform any approximation. In addition, by manipulating the equations and hardware implementation of such equations appropriately, the stored values of log correction values may be confined to a bounded region (i.e., small complexity) thereby reducing overall hardware size and complexity. By employing the exact calculations employed in the decoding processing, this provides a better performance than any prior art approaches that use certain types of approximations in their respective decoding processing.

Figures 7A, 7B:
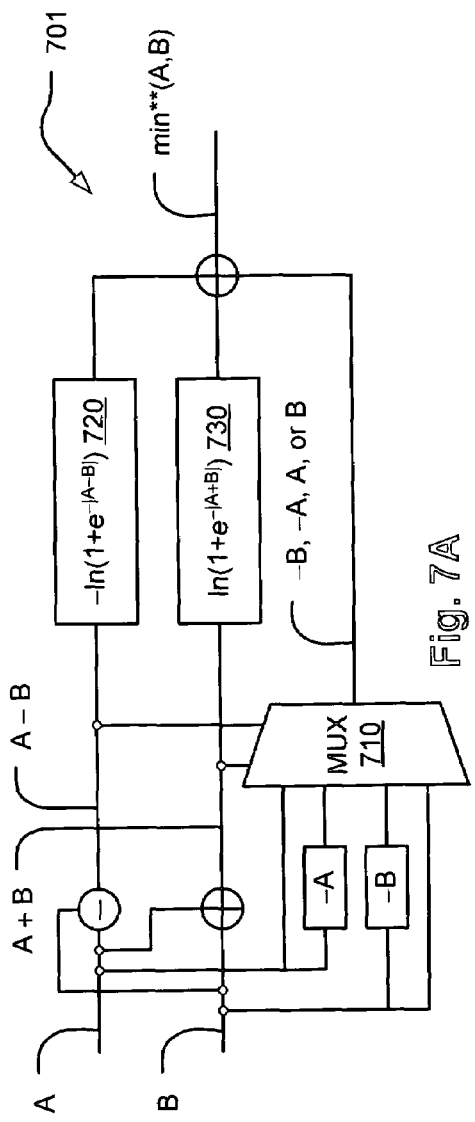
FIG. 7A is a diagram illustrating an embodiment of min** processing that may be constructed in accordance with certain aspects of the invention.
FIG. 7B is a diagram illustrating a table of possible log correction factors that may be employed using the embodiment of min** processing of FIG. 7A.

FIG. 7A is a diagram illustrating an embodiment of min processing 701 that may be constructed in accordance with certain aspects of the invention. This functional block operates on two input values, shown as A and B. The difference between the two values, A−B, and the sum of the two values, A+B, are both calculated. Four possible values, −B, −A, A, and B, are also provided to a MUX (Multiplexor) 710, whose selection signals determine the output as being only one of −B, −A, A, and B based on the sign bit of the difference between the two values, A−B, as well as the sign bit of sum of the two values, A+B. It is noted that only one of −B, −A, A, and B is output from the MUX 710, and the MUX 710 has 2 select signals. It is also noted that this approach to the inputs and selection of the MUX 710 is a significant departure from the prior art approaches to perform min processing, in that, two select signals are employed to select which of the 4 possible values (−B, −A, A, and B) is to be output from the MUX 710.

The selection of which of the 4 possible values (−B, −A, A, and B) is to be output from the MUX 710, is determined based on the sign bit of the difference between the two values, A−B, as well as the sign bit of sum of the two values, A+B. This output from the MUX 710 may be represented as follows:

−B, when A−B<0, A+B<0;

−A, when A−B>0, A+B<0;

A, when A−B<0, A+B>0; and

B, when A−B>0, A+B>0.

Also, the difference between the two values, A−B, and the sum of the two values, A+B, are each provided to a first log correction functional block 720 and a second log correction functional block 730, respectively. The difference between the two values, A−B, is used by the first log correction functional block 720 to determine a first log correction factor, $-\ln(1+e^{-|A-B|})$. This first log correction factor includes an absolute value function of the difference between the two values, i.e. A−B. Analogously, the sum of the two values, i.e. A+B, is used by the second log correction functional block 730 to determine a second log correction factor, $\ln(1+e^{-|A+B|})$. This second log correction factor includes an absolute value function of the sum of the two values, A+B.

The min processing resultant is composed of the sum of the first log correction factor, $-\ln(1+e^{-|A-B|})$ (that is based on an absolute value of the difference between the first value and the second value, i.e. A−B), the second log correction factor, $\ln(1+e^{-|A+B|})$ (that is based on an absolute value of the sum of the first value and the second value, i.e. A+B), as well as the appropriately selected one of the 4 possible values (−B, −A, A, and B) that is to be output from the MUX 710**.

In other words, the first log correction functional block 720 is operable to provide the first log correction factor, $-\ln(1+e^{-|A-B|})$, that is based on an absolute value of the difference between the first value and the second value, i.e. A−B. Analogously, the second log correction functional block 730 is operable to provide the second log correction factor, $\ln(1+e_{-|A+B|})$, that is based on an absolute value of the sum of the first value and the second value, i.e. A+B.

It is noted that if the (EQ 1A and EQ 1B) were not to be combined with the (EQ 2) to generate the (EQ 3), then the complexity required to implement the second log correction factor, $\ln(1+e^{-(A+B)})$, (note: this being a second log correction factor which is NOT based on an absolute value of the sum of the first value and the second value, i.e. A+B) would be significant because the result of (EQ 2) would include either the values −A or −B if A+B<0.

As an example, if one were to implement the second log correction factor, $\ln(1+e^{-(A+B)})$, of (EQ 1B) with A and B as 6-bit values using a LUT (Look-Up Table), then the LUT input would have to be 7 bits since these values would be the result of A+B. In addition, the LUT output would be 6 bits because it would need to include the values of −A and −B. Such a LUT would requires a large complexity and add a longer delay to the circuitry that is required to perform such operations.

However, for each of the four possible min** processing resultants shown in the (EQ 3), both the first log correction factor, $-\ln(1+e^{-|A-B|})$, that is based on an absolute value of the difference between the first value and the second value, i.e. A−B, and the second log correction factor, $\ln(1+e^{-|A+B|})$, that is based on an absolute value of the sum of the first value and the second value, i.e. A+B, are outputs that are bounded between the values of approximately 0 and 0.694. Therefore, the LUTs required to store these possible log correction factors is much smaller than is required using the prior art approaches. In fact, the output of each LUT for each of the first log correction factor and the second log correction factor may be as few as one or two bits. This can be implemented in hardware using just a few gates instead of some type of ROM (Read Only Memory) structure that is inherently more complex, would require more surface area, and would cost more.

Figures 6A, 6B:
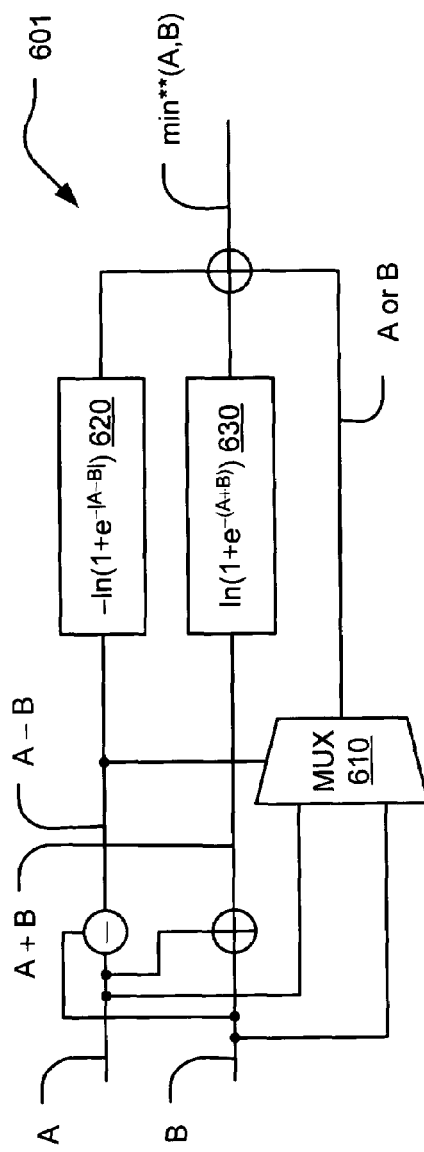
FIG. 6A is a diagram illustrating a prior art embodiment of min** (min-double-star) processing.
FIG. 6B is a diagram illustrating a table of possible log correction factors that may be employed using the prior art embodiment of min** processing of FIG. 6A.

Using 0.13 μm (micro-meter) CMOS (Complementary Metal Oxide Semiconductor) technology, the prior art embodiment of min processing 601 of the FIG. 6A is approximately 2850 μm² in silicon area compared to a significantly less area of only approximately 2250 μm² for the embodiment of min processing 701 of the FIG. 7A that may be constructed in accordance with certain aspects of the invention.

For the prior art embodiment of min processing 601 of the FIG. 6A, the longest processing delay path is from the input A or B through the A+B adder and the retrieval of the second log correction factor, $\ln(1+e^{-(A+B)})$ from its corresponding LUT. This delay of the prior art approach is longer than the delay than the same path of the embodiment of min processing 701 of the FIG. 7A because the LUT is much smaller for the second log correction factor, $\ln(1+e^{-|A+B|})$, that is based on an absolute value of the sum of the first value and the second value, i.e. A+B. Therefore, an actual hardware implementation (i.e., circuit) that perform the functionality of the embodiment of min processing 701 of the FIG. 7A is not only smaller, but it is also faster than an actual hardware implementation (i.e., circuit) that perform the functionality of the prior art embodiment of min processing 601 of the FIG. 6A.

FIG. 7B is a diagram illustrating a table of possible log correction factors 702 that may be employed using the embodiment of min processing of FIG. 7A**. As can be seen, this table includes a plurality of possible log correction factors for the second log correction factor, $\ln(1+e^{-|A+B|})$, that is based on an absolute value of the sum of the first value and the second value, i.e. A+B. Upon close inspection of this table, it can be seen that the possible values for this second log correction factor, $\ln(1+e^{-|A+B|})$, are bounded to a particular region. For example, as the sum of the first value and the second value, i.e. A+B, becomes either larger or smaller, this second log correction factor, $\ln(1+e^{-|A+B|})$, becomes a value of zero. This allows for a significant reduction in the memory (and subsequently size of a memory storage device) that is required to store the possible values of this second log correction factor, $\ln(1+e^{-|A+B|})$. More specifically, within a communication device operating within finite precision mathematics (e.g., in a digital system), for values of the sum of the first value and the second value, i.e. A+B, is greater than 1.50 or less than −1.50, then this second log correction factor, $\ln(1+e^{-|A+B|})$, is employed as being a value of zero.

Figures 8A, 8B:
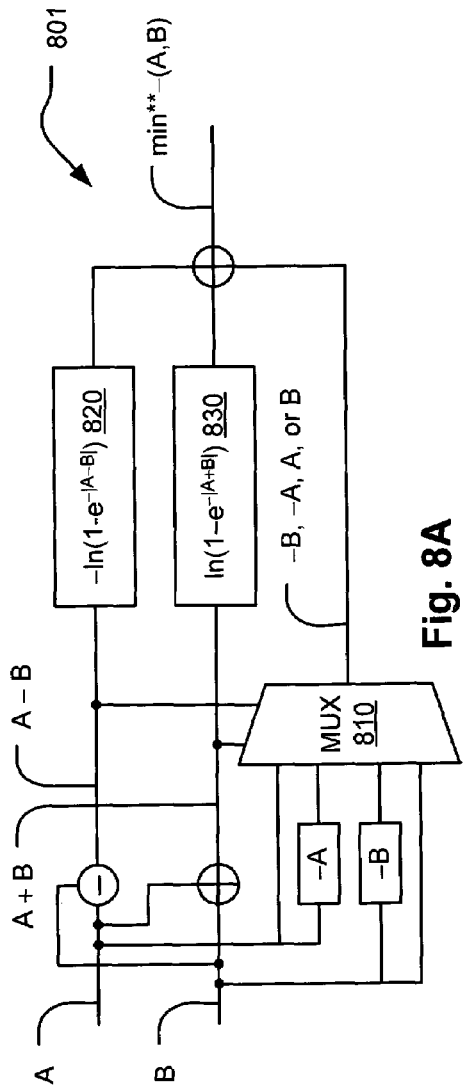
FIG. 8A is a diagram illustrating an embodiment of min**− processing that may be constructed in accordance with certain aspects of the invention.
FIG. 8B is a diagram illustrating a table of possible log correction factors that may be employed using the embodiment of min**− processing of FIG. 8A.

FIG. 8A is a diagram illustrating an embodiment of min− processing 801 that may be constructed in accordance with certain aspects of the invention. This design is very analogous to the min processing 701 of the FIG. 7A.

This functional block also operates on two input values, shown as A and B. The difference between the two values, A−B, and the sum of the two values, A+B, are both calculated. Four possible values, −B, −A, A, and B, are also provided to a MUX (Multiplexor) 810, whose selection signals determine the output as being only one of −B, −A, A, and B based on the sign bit of the difference between the two values, A−B, as well as the sign bit of sum of the two values, A+B. It is noted that only one of −B, −A, A, and B is output from the MUX 810, and the MUX 810 has 2 select signals.

The selection of which of the 4 possible values (−B, −A, A, and B) is to be output from the MUX 810, is determined based on the sign bit of the difference between the two values, A−B, as well as the sign bit of sum of the two values, A+B. This output from the MUX 710 may be represented as follows:

−B, when A−B<0, A+B<0;

−A, when A−B>0, A+B<0;

A, when A−B<0, A+B>0; and

B, when A−B>0, A+B>0.

Also, the difference between the two values, A−B, and the sum of the two values, A+B, are each provided to a first log correction functional block 820 and a second log correction functional block 830, respectively. The difference between the two values, A−B, is used by the first log correction functional block 820 to determine a first log correction factor, $-\ln(1-e^{-|A-B|})$. This first log correction factor includes an absolute value function of the difference between the two values, i.e. A−B. Analogously, the sum of the two values, i.e. A+B, is used by the second log correction functional block 830 to determine a second log correction factor, $\ln(1-e^{-|A+B|})$. This second log correction factor includes an absolute value function of the sum of the two values, A+B.

The min− processing resultant is composed of the sum of the first log correction factor, $-\ln(1-e^{-|A-B|})$ (that is based on an absolute value of the difference between the first value and the second value, i.e. A−B), the second log correction factor, $\ln(1-e^{-|A+B|})$ (that is based on an absolute value of the sum of the first value and the second value, i.e. A+B), as well as the appropriately selected one of the 4 possible values (−B, −A, A, and B) that is to be output from the MUX 810**.

In other words, the first log correction functional block 820 is operable to provide the first log correction factor, $-\ln(1-e^{-|A-B|})$, that is based on an absolute value of the difference between the first value and the second value, i.e. A−B. Analogously, the second log correction functional block 830 is operable to provide the second log correction factor, $\ln(1-e^{-|A+B|})$, that is based on an absolute value of the sum of the first value and the second value, i.e. A+B.

It is noted that if the (EQ 5A and EQ 5B) were not to be combined with the (EQ 6) to generate the (EQ 7), then the complexity required to implement the second log correction factor, $\ln(|1-e^{-(A+B)}|)$, (note: this being a second log correction factor which is NOT based on an absolute value of the sum of the first value and the second value, i.e. A+B) would be significant because the result of (EQ 6) would include either the values −A or −B if A+B<0.

As an example, if one were to implement the second log correction factor, $\ln(|1-e^{-(A+B)}|)$, of (EQ 5B) with A and B as 6-bit values using a LUT (Look-Up Table), then the LUT input would have to be 7 bits since these values would be the result of A+B. In addition, the LUT output would be 6 bits because it would need to include the values of −A and −B. Such a LUT would requires a large complexity and add a longer delay to the circuitry that is required to perform such operations.

However, for each of the four possible min** processing resultants shown in the (EQ 3), both the first log correction factor, $-\ln(1-e^{-|A-B|})$, that is based on an absolute value of the difference between the first value and the second value, i.e. A−B, and the second log correction factor, $\ln(1-e^{-|A+B|})$, that is based on an absolute value of the sum of the first value and the second value, i.e. A+B, are outputs that are also bounded and provide all of the many benefits mentioned thereof when having a bounded region over which values may be stored in a LUT.

FIG. 8B is a diagram illustrating a table of possible log correction factors 802 that may be employed using the embodiment of min- processing of FIG. 8**A. As can be seen, this table includes a plurality of possible log correction factors for the second log correction factor, $\ln(1-e^{-|A+B|})$, that is based on an absolute value of the sum of the first value and the second value, i.e. A+B. Upon close inspection of this table, it can be seen that the possible values for this second log correction factor, $\ln(1-e^{-|A+B|})$, are bounded to a particular region. For example, as the sum of the first value and the second value, i.e. A+B, becomes either larger or smaller, this second log correction factor, $\ln(1-e^{-|A+B|})$, becomes a value of zero. This allows for a significant reduction in the memory (and subsequently size of a memory storage device) that is required to store the possible values of this second log correction factor, $\ln(1+e^{-|A+B|})$. More specifically, within a communication device operating within finite precision mathematics (e.g., in a digital system), for values of the sum of the first value and the second value, i.e. A+B, or the difference between the first value and the second value, i.e. A−B, is greater than 1.75 or less than −1.75, then this second log correction factor, $\ln(1+e^{-|A+B|})$, is employed as being a value of −0.25.

Also with respect to FIG. 8B, it is noted that this same table may be employed to represent a plurality of possible log correction factors for another log correction factor, $\ln(1-e^{-|A-B|})$, that is based on an absolute value of a difference between the first value and the second value, i.e. A−B.

Moreover, with respect to FIG. 8B, it is noted that the log correction factor (either one) that is listed as corresponding to either A+B or A−B being zero is depicted as −2.25. In other words, when A+B=0 or A−B=0, then the table indicates that both $\ln(1+e^{-|A+B|})$ and $\ln(1-e^{-|A-B|})$ have a value of −2.25. This value is selected by a designer. The mathematical result if A−B=0 would result in the log correction value of $\ln(1-e^{-|A-B|})$ to attempt to take the log of a zero value (which is an illegal condition). Consequently, when a designer implements this design, the designer selects a finite value for use within the table such that the table still exhibits the appropriate characteristics to support this processing.

Several of these previous embodiments have shown the operation of various min processing functional blocks wherein the min processing resultant is summed together to generate the actual min processing resultant in its final form. For example, the min processing resultant is composed of the sum of the first log correction factor, $-\ln(1+e^{-|A-B|})$ (that is based on an absolute value of the difference between the first value and the second value, i.e. A−B), the second log correction factor, $\ln(1+e^{-|A+B|})$ (that is based on an absolute value of the sum of the first value and the second value, i.e. A+B), as well as the appropriately selected one of the 4 possible values (−B, −A, A, and B). This possible values of the min** processing resultants are shown also within the (EQ 3) in their summed together form.

However, another way to enhance the design for speed and area of an actual communication device that is implemented to perform such calculations is to remove the adder at the min processing functional block output. For example, each of the first log correction factor, $-\ln(1+e^{-|A-B|})$, the second log correction factor, $\ln(1+e^{-|A+B|})$, as well as the appropriately selected one of the 4 possible values (−B, −A, A, and B), may be kept separate and not summed together before outputting them from the min processing functional block.

It is also noted, as can be seen above by the presentation of the calculations required for min processing, that min processing may be perform using both min processing and min− processing. Analogously, as can also be seen above by the presentation of the calculations required for max processing, that max processing may be perform using both max processing and max− processing. Some of the following embodiments show possible constructions of such functional blocks to perform min processing and min− processing as well as max processing and max− processing in accordance with certain aspects of the invention.

FIG. 9A is a diagram illustrating an embodiment of min processing performed in cooperation with min− (min-double-star-minus) processing 901 in accordance with certain aspects of the invention. This embodiment also operates on two values, A and B. However, in this embodiment, B may be viewed as a min processing resultant from a previous iteration. This previous min processing resultant (B) then undergoes min processing with the next value (A). As mentioned above, the min processing resultant may be kept separate for use in subsequent iterations. For example, the min processing resultant (B) may be kept in the form of separate values for the first log correction factor, $-\ln(1+e^{-|A-B|})$, the second log correction factor, $\ln(1+e^{-|A+B|})$, as well as the appropriately selected one of the 4 previous possible values (−B, −A, A, and B). This is why the min processing functional block 910 within this diagram shows B as being a 3 part signal that is fed back from a register 911 (shown as REG 911). The min processing resultant, B, that is output from the min processing functional block 910, is then passed via the register 911 and a register 912 (shown as REG 912) to a min− processing functional block 920. The output from the min− processing functional block 920 is also kept in a 3 part signal format for ease of use within subsequent operations.

Before looking at some max processing functional block embodiments and max− processing functional block embodiments in more detail, the max processing resultant and the max− processing resultant are provided again.

max** processing is provided below:

$$\max{}^{**}(A, B) = \ln\frac{1+e^{A+B}}{e^A + e^B} \qquad \text{(EQ 9A)}$$

$$\max{}^{**}(A, B) = \max(A, B) + \ln(1 + e^{-|A-B|}) - \ln(1 + e^{-(A+B)}) \qquad \text{(EQ 9B)}$$

In similar fashion to how the other of the processing resultants may be broken down to four possible different values, the max** processing resultant may also be broken down to four possible different values.

$$\max{}^{**}(A, B) = \qquad \text{(EQ 10)}$$

$$\begin{cases} B + \ln(1+e^{-|A-B|}) - \ln(1+e^{-|A+B|}) & A-B<0, A+B<0 \\ A + \ln(1+e^{-|A-B|}) - \ln(1+e^{-|A+B|}) & A-B>0, A+B<0 \\ -A + \ln(1+e^{-|A-B|}) - \ln(1+e^{-|A+B|}) & A-B<0, A+B>0 \\ -B + \ln(1+e^{-|A-B|}) - \ln(1+e^{-|A+B|}) & A-B>0, A+B>0 \end{cases} \text{ for }$$

max**− processing is provided below:

$$\max{}^{**}-(A, B) = \ln\left(\frac{e^{-(A+B)}}{e^{-B} - e^{-A}}\right) \qquad \text{(EQ 11A)}$$

$$\max{}^{**}-(A, B) = \max(A, B) + \ln(1 - e^{-|A-B|}) - \ln(|1 - e^{-(A+B)}|) \qquad \text{(EQ 11B)}$$

In similar fashion to how the other of the processing resultants may be broken down to four possible different values, the max**− processing resultant may also be broken down to four possible different values.

$$\max{}^{**}-(A,B)=\begin{cases} B+\ln(1-e^{-|A-B|})-\ln(1-e^{-|A+B|}) & A-B<0, A+B<0 \\ A+\ln(1-e^{-|A-B|})-\ln(1-e^{-|A+B|}) & A-B>0, A+B<0 \\ -A+\ln(1-e^{-|A-B|})-\ln(1-e^{-|A+B|}) & A-B<0, A+B>0 \\ -B+\ln(1-e^{-|A-B|})-\ln(1-e^{-|A+B|}) & A-B>0, A+B>0 \end{cases} \text{ for }$$

(EQ 12)

The implementation of such a max processing functional block may be performed analogously to a min processing functional block. However, the designed must be sure to account for the differences in the actual calculations performed within min processing and max processing.

It is also noted here that the value of a "first log correction factor" and the "second log correction factor" are different for each of the embodiments of min processing and max processing.

In min** processing, these log correction factors are as follows:
1. first log correction factor, $-\ln(1+e^{-|A-B|})$; and
2. second log correction factor, $\ln(1+e^{-|A+B|})$.

In max** processing, these log correction factors are as follows:
1. first log correction factor, $\ln(1+e^{-|A-B|})$; and
2. second log correction factor, $-\ln(1+e^{-|A+B|})$.

Generally speaking, the signs of the "first log correction factor" and the "second log correction factor" are switched within max processing when compared to min processing.

FIG. 9B is a diagram illustrating an embodiment of max (max-double-star) processing performed in cooperation with max− (max-double-star-minus) processing 902 in accordance with certain aspects of the invention. This embodiment is somewhat analogous to the previous embodiment with the difference being that max processing and max− processing is being performed instead of min processing and min− processing.

This embodiment also operates on two values, A and B. However, in this embodiment, B may be viewed as a max processing resultant from a previous iteration. This previous max processing resultant (B) then undergoes max processing with the next value (A). As mentioned above, the max processing resultant may be kept separate for use in subsequent iterations. For example, the max processing resultant (B) may be kept in the form of separate values for the first log correction factor, $\ln(1+e^{-|A-B|})$, the second log correction factor, $-\ln(1+e^{-|A+B|})$, as well as the appropriately selected one of the 4 previous possible values (B, A, −A, and −B). This is why the max processing functional block 960 within this diagram shows B as being a 3 part signal that is fed back from a register 961 (shown as REG 961). The max processing resultant, B, that is output from the max processing functional block 960, is then passed via the register 961 and a register 962 (shown as REG 962) to a max− processing functional block 970. The output from the max− processing functional block 970 is also kept in a 3 part signal format for ease of use within subsequent operations.

Figure 10:
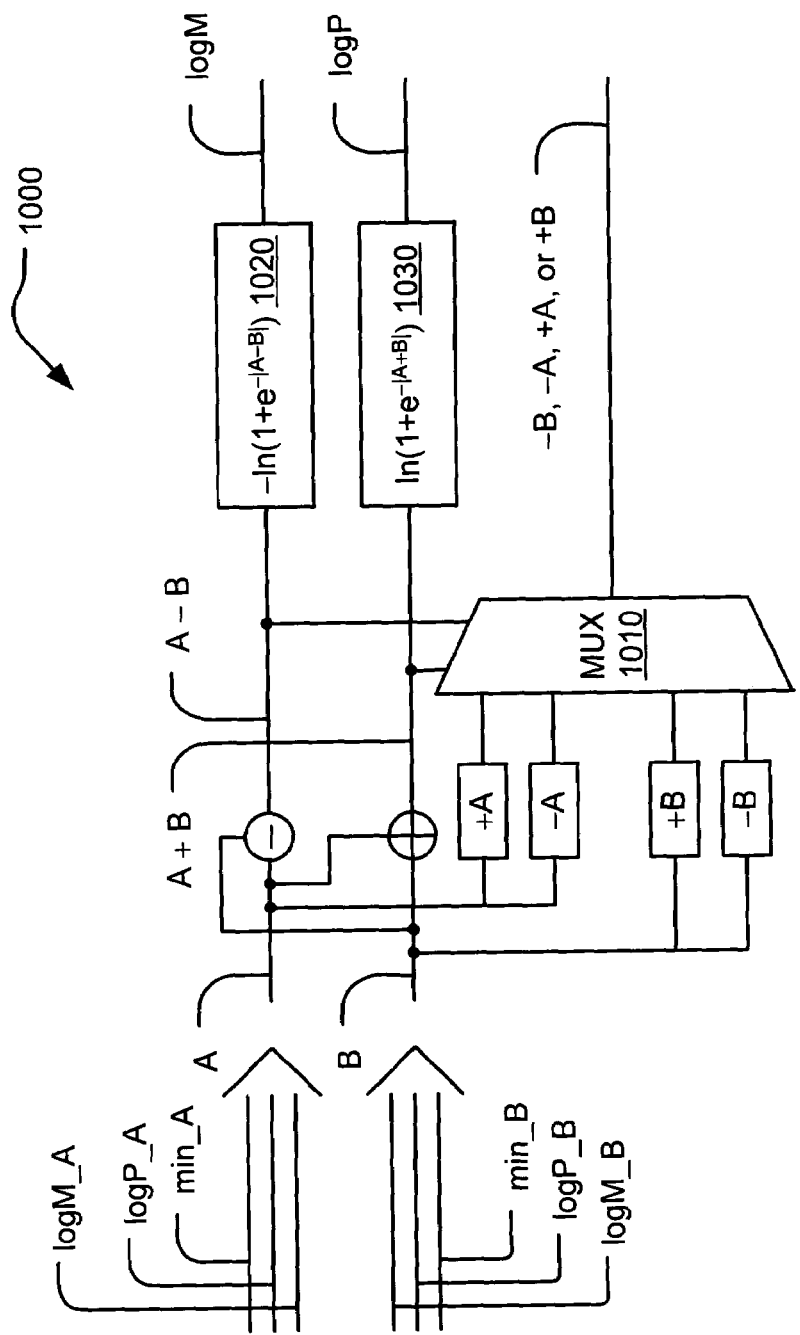
FIG. 10 is a diagram illustrating an embodiment of enhanced min** processing that may be constructed in accordance with certain aspects of the invention.

FIG. 10 is a diagram illustrating an embodiment of enhanced min processing 1000 that may be constructed in accordance with certain aspects of the invention. This diagram shows explicitly the separate of each of the two values, A and B, into their respective 3 part components. For example, A is shown as having 3 parts: log M_A, log P_A, and min_A. Similarly, B is shown as having 3 parts: log M_B, log P_B, and min_B. In some respects, this embodiment is also very analogous to the embodiment of min processing of the FIG. 7A.

For example, this functional block operates on two input values, shown as A and B (note: each of A and B is broken down into its 3 components). The difference between the two values, A−B, and the sum of the two values, A+B, are both calculated. Four possible values, −B, −A, A, and B, are also provided to a MUX (Multiplexor) 1010, whose selection signals determine the output as being only one of −B, −A, A, and B based on the sign bit of the difference between the two values, A−B, as well as the sign bit of sum of the two values, A+B. It is noted that only one of −B, −A, A, and B is output from the MUX 1010, and the MUX 1010 has 2 select signals. It is also noted that this approach to the inputs and selection of the MUX 1010 is a significant departure from the prior art approaches to perform min** processing, in that, two select signals are employed to select which of the 4 possible values (−B, −A, and B) is to be output from the MUX 1010.

The selection of which of the 4 possible values (−B, −A, A, and B) is to be output from the MUX 1010, is determined based on the sign bit of the difference between the two values, A−B, as well as the sign bit of sum of the two values, A+B. This output from the MUX 1010 may be represented as follows:

−B, when A−B<0, A+B<0;

−A, when A−B>0, A+B<0;

A, when A−B<0, A+B>0; and

B, when A−B>0, A+B>0.

Also, the difference between the two values, A−B, and the sum of the two values, A+B, are each provided to a first log correction functional block 1020 and a second log correction functional block 1030, respectively. The difference between the two values, A−B, is used by the first log correction functional block 1020 to determine a first log correction factor, $-\ln(1+e^{-|A-B|})$. This first log correction factor includes an absolute value function of the difference between the two values, i.e. A−B. Analogously, the sum of the two values, i.e. A+B, is used by the second log correction functional block 1030 to determine a second log correction factor, $\ln(1+e^{-|A+B|})$. This second log correction factor includes an absolute value function of the sum of the two values, A+B.

However, this embodiment operates with a difference to the previous embodiment of FIG. 7A, in that, there is no adder near the output of this min processing functional block that operates to combine the first log correction factor, $-\ln(1+e^{-|A-B|})$, the second log correction factor, $\ln(1+e^{-|A+B|})$, as well as the appropriately selected one of the 4 previous possible values (−B, −A, A, and B). Each of the 3 components of a min processing resultant is kept separate for use and ease within subsequent iterations and calculations. That is to say, a 3 part signal is output from this min** processing functional block, and it is shown as log M, log P, and (−B, −A, A, or B). Clearly, if it is desired in some embodiments, these values may be added together in similar fashion as is shown within the FIG. 7A.

Figure 11:
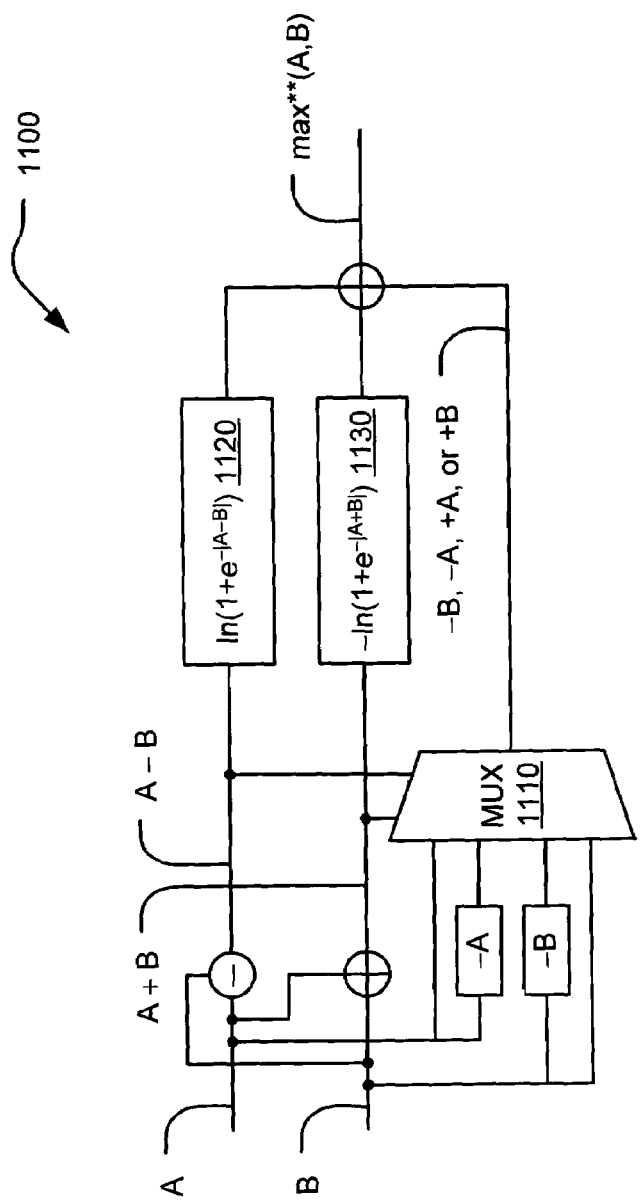
FIG. 11 is a diagram illustrating an embodiment of max** processing that may be constructed in accordance with certain aspects of the invention.

FIG. 11 is a diagram illustrating an embodiment of max processing 1100 that may be constructed in accordance with certain aspects of the invention. This embodiment is somewhat analogous to the min processing embodiment of the FIG. 7A.

This functional block operates on two input values, shown as A and B. The difference between the two values, A−B, and the sum of the two values, A+B, are both calculated. Four possible values, −B, −A, A, and B, are also provided to a MUX (Multiplexor) 1110, whose selection signals determine the output as being only one of B, A, −B, and −A based on the sign bit of the difference between the two values, A−B, as well as the sign bit of sum of the two values, A+B. It is noted that only one of B, A, −B, and −A is output from the MUX 1110, and the MUX 1110 has 2 select signals.

The selection of which of the 4 possible values (B, A, −B, and −A) is to be output from the MUX 1110, is determined based on the sign bit of the difference between the two values, A−B, as well as the sign bit of sum of the two values, A+B. This output from the MUX 1110 may be represented as follows:

$B$, when $A-B<0$, $A+B<0$;

$A$, when $A-B>0$, $A+B<0$;

$-A$, when $A-B<0$, $A+B>0$; and $-B$, when $A-B>0$, $A+B>0$.

Also, the difference between the two values, A−B, and the sum of the two values, A+B, are each provided to a first log correction functional block 1120 and a second log correction functional block 1130, respectively. It is again noted that the value of a "first log correction factor" and the "second log correction factor" are different for each of the embodiments of min processing and max processing.

The difference between the two values, A−B, is used by the first log correction functional block 1120 to determine a first log correction factor, $\ln(1+e^{-|A-B|})$. This first log correction factor includes an absolute value function of the difference between the two values, i.e. A−B. Analogously, the sum of the two values, i.e. A+B, is used by the second log correction functional block 1130 to determine a second log correction factor, $-\ln(1+e^{-|A+B|})$. This second log correction factor includes an absolute value function of the sum of the two values, A+B.

The max processing resultant is composed of the sum of the first log correction factor, $\ln(1+e^{-|A-B|})$ (that is based on an absolute value of the difference between the first value and the second value, i.e. A−B), the second log correction factor, $-\ln(1+e^{-|A+B|})$ (that is based on an absolute value of the sum of the first value and the second value, i.e. A+B), as well as the appropriately selected one of the 4 possible values (B, A, −B, and −A) that is to be output from the MUX 1110**.

In other words, the first log correction functional block 1120 is operable to provide the first log correction factor, $\ln(1+e^{-|A-B|})$, that is based on an absolute value of the difference between the first value and the second value, i.e. A−B. Analogously, the second log correction functional block 1130 is operable to provide the second log correction factor, $-\ln(1+e^{-|A+B|})$, that is based on an absolute value of the sum of the first value and the second value, i.e. A+B.

All of the benefits describe above with respect to min processing regarding the fact that the use of the "first log correction factor" and the "second log correction factor" being functions of absolute values of terms is also applicable with respect to these embodiments of max processing. The savings and improvement, in terms of memory, space, and cost are all applicable with respect to these embodiments of max processing. This is because the signs of the "first log correction factor" and the "second log correction factor" are simply switched within max processing when compared to min** processing.

Figure 12:
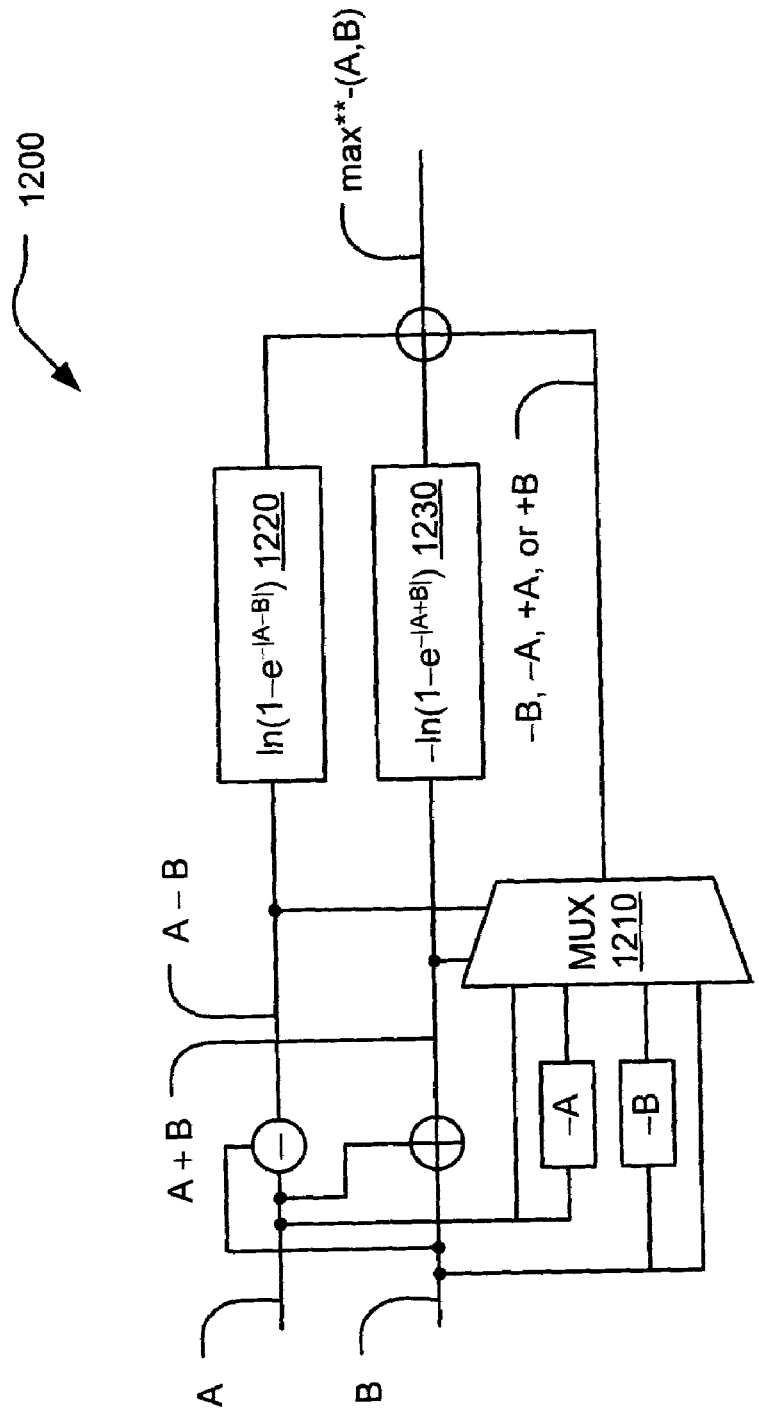
FIG. 12 is a diagram illustrating an embodiment of max**− processing that may be constructed in accordance with certain aspects of the invention.

FIG. 12 is a diagram illustrating an embodiment of max− processing 1200 that may be constructed in accordance with certain aspects of the invention. This embodiment is somewhat analogous to the min− processing embodiment of the FIG. 8A.

This functional block operates on two input values, shown as A and B. The difference between the two values, A−B, and the sum of the two values, A+B, are both calculated. Four possible values, −B, −A, A, and B, are also provided to a MUX (Multiplexor) 1210, whose selection signals determine the output as being only one of B, A, −B, and −A based on the sign bit of the difference between the two values, A−B, as well as the sign bit of sum of the two values, A+B. It is noted that only one of B, A, −B, and −A is output from the MUX 1210, and the MUX 1210 has 2 select signals.

The selection of which of the 4 possible values (B, A, −B, and −A) is to be output from the MUX 1210, is determined based on the sign bit of the difference between the two values, A−B, as well as the sign bit of sum of the two values, A+B. This output from the MUX 1210 may be represented as follows:

$B$, when $A-B<0$, $A+B<0$;

$A$, when $A-B>0$, $A+B<0$;

$-A$, when $A-B<0$, $A+B>0$; and $-B$, when $A-B>0$, $A+B>0$.

Also, the difference between the two values, A−B, and the sum of the two values, A+B, are each provided to a first log correction functional block 1220 and a second log correction functional block 1230, respectively. It is again noted that the value of a "first log correction factor" and the "second log correction factor" are different for each of the embodiments of the min− processing and max− processing.

The difference between the two values, A−B, is used by the first log correction functional block 1220 to determine a first log correction factor, $\ln(1-e^{-|A-B|})$. This first log correction factor includes an absolute value function of the difference between the two values, i.e. A−B. Analogously, the sum of the two values, i.e. A+B, is used by the second log correction functional block 1230 to determine a second log correction factor, $-\ln(1-e^{-|A+B|})$. This second log correction factor includes an absolute value function of the sum of the two values, A+B.

The max− processing resultant is composed of the sum of the first log correction factor, $\ln(1-e^{-|A-B|})$ (that is based on an absolute value of the difference between the first value and the second value, i.e. A−B), the second log correction factor, $-\ln(1-e^{-|A+B|})$ (that is based on an absolute value of the sum of the first value and the second value, i.e. A+B), as well as the appropriately selected one of the 4 possible values (B, A, −B, and −A) that is to be output from the MUX 1210**.

In other words, the first log correction functional block 1220 is operable to provide the first log correction factor, $\ln(1-e^{-|A-B|})$, that is based on an absolute value of the difference between the first value and the second value, i.e. A−B. Analogously, the second log correction functional block 1230 is operable to provide the second log correction factor, $-\ln(1-e^{-|A+B|})$, that is based on an absolute value of the sum of the first value and the second value, i.e. A+B.

All of the benefits describe above with respect to min processing or min− processing regarding the fact that the use of the "first log correction factor" and the "second log correction factor" being functions of absolute values of terms is also applicable with respect to these embodiments of max processing or max− processing. The savings and improvement, in terms of memory, space, and cost are all applicable with respect to these embodiments of max processing or max− processing.

Figure 13:
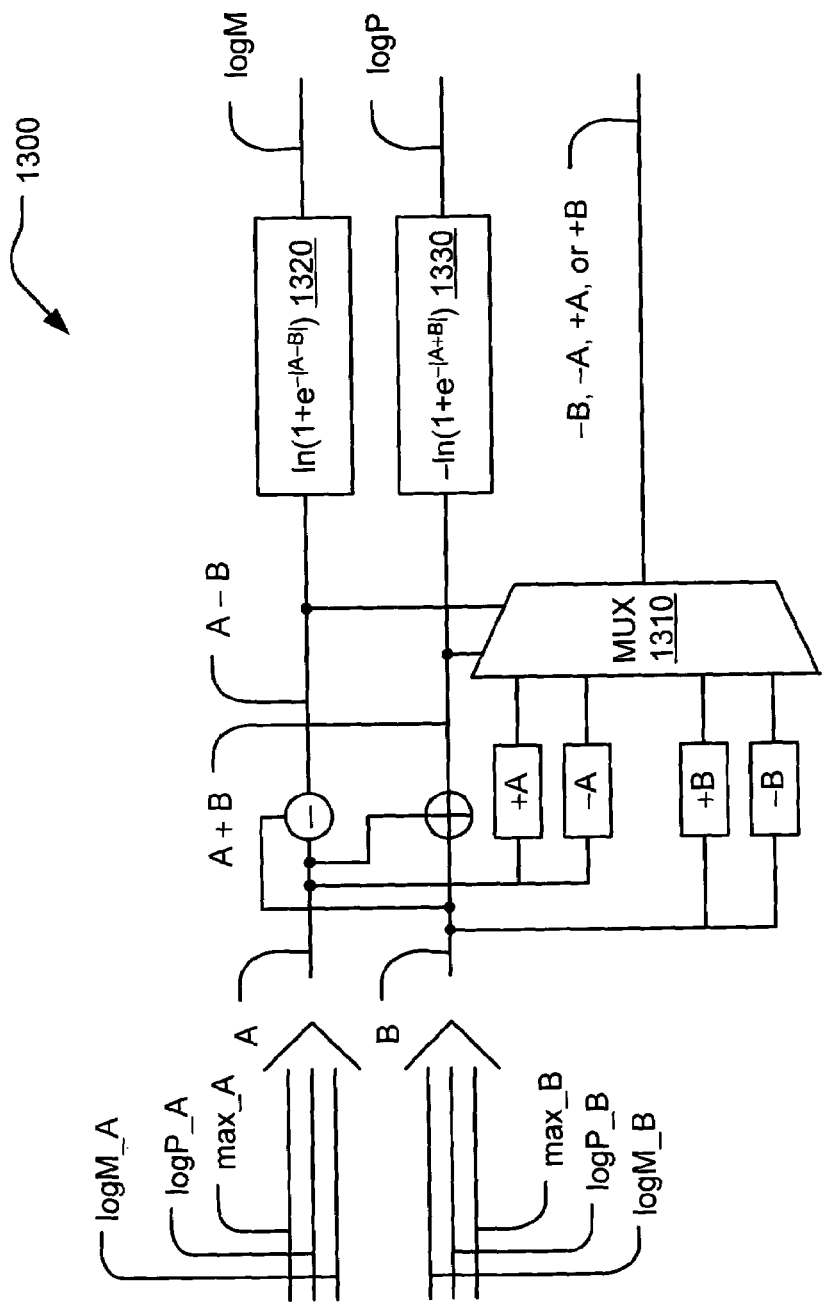
FIG. 13 is a diagram illustrating an embodiment of enhanced max** processing that may be constructed in accordance with certain aspects of the invention.

FIG. 13 is a diagram illustrating an embodiment of enhanced max processing 1300 that may be constructed in accordance with certain aspects of the invention. This embodiment is somewhat analogous to the embodiment of min processing of the FIG. 10 with respect to the fact that each of the values, A and B, are broken down into 3 part signals.

This diagram shows explicitly the separate of each of the two values, A and B, into their respective 3 part components. For example, A is shown as having 3 parts: log M_A, log P_A, and max_A. Similarly, B is shown as having 3 parts: log M_B, Log P_B, and max_B. In addition, in some respects, this embodiment is also very analogous to the embodiment of max** processing of the FIG. 11.

For example, this functional block operates on two input values, shown as A and B (note: each of A and B is broken down into its 3 components). The difference between the two values, A−B, and the sum of the two values, A+B, are both calculated. Four possible values, B, A, −B, and −A, are also provided to a MUX (Multiplexor) 1310, whose selection signals determine the output as being only one of B, A, −B, and −A based on the sign bit of the difference between the two values, A−B, as well as the sign bit of sum of the two values, A+B. It is noted that only one of B, A, −B, and −A is output from the MUX 1310, and the MUX 1310 has 2 select signals.

The selection of which of the 4 possible values (B, A, −B, and −A) is to be output from the MUX 1310, is determined based on the sign bit of the difference between the two values, A−B, as well as the sign bit of sum of the two values, A+B. This output from the MUX 1310 may be represented as follows:

$B$, when $A−B<0, A+B<0$;

$A$, when $A−B>0, A+B<0$;

$−A$, when $A−B<0, A+B>0$; and $−B$, when $A−B>0, A+B>0$.

Also, the difference between the two values, A−B, and the sum of the two values, A+B, are each provided to a first log correction functional block 1320 and a second log correction functional block 1330, respectively. The difference between the two values, A−B, is used by the first log correction functional block 1320 to determine a first log correction factor, $\ln(1+e^{-|A-B|})$. This first log correction factor includes an absolute value function of the difference between the two values, i.e. A−B. Analogously, the sum of the two values, i.e. A+B, is used by the second log correction functional block 1330 to determine a second log correction factor, $-\ln(1+e^{-|A+B|})$. This second log correction factor includes an absolute value function of the sum of the two values, A+B.

However, this embodiment operates with a difference to the previous embodiment of max processing of the FIG. 11, in that, there is no adder near the output of this max processing functional block that operates to combine the first log correction factor, $\ln(1+e^{-|A-B|})$, the second log correction factor, $-\ln(1+e^{-|A+B|})$, as well as the appropriately selected one of the 4 previous possible values (B, A, −B, and −A). Each of the 3 components of a max processing resultant is kept separate for use and ease within subsequent iterations and calculations. That is to say, a 3 part signal is output from this max processing functional block, and it is shown as log M, log P, and (B, A, −B, and −A). Clearly, if it is desired in some embodiments, these values may be added together in similar fashion as is shown within the FIG. 11.

Again, as mentioned above, in max** processing, these log correction factors are as follows:

1. first log correction factor, $\ln(1+e^{-|A-B|})$; and
2. second log correction factor, $-\ln(1+e^{-|A+B|})$.

Similar to the fact that the log correction factors for min processing are bounded to a particular region for various values of the sum of the first value and the second value, i.e. A+B, as well as the difference between the first value and the second value, i.e. A−B, each of the corresponding log correction factors employed for max processing are also bounded to a particular region.

FIG. 14A is a diagram illustrating a bounded table of possible log correction factors 1401, as a function of an absolute value of a difference between two values, that may be employed using the various embodiments of min or max processing that may be constructed in accordance with certain aspects of the invention.

FIG. 14B is a diagram illustrating a bounded table of possible log correction factors 1402, as a function of an absolute value of a sum of two values, that may be employed using the various embodiments of min or max processing that may be constructed in accordance with certain aspects of the invention.

Upon close inspection of the values of these two tables, it can be seen that the possible values for the first log correction factor, $\ln(1+e^{-|A-B|})$ the second log correction factor, $-\ln(1+e^{-|A+B|})$, are each bounded to a particular region.

For example, as the difference between the first value and the second value, i.e. A−B, becomes either larger or smaller, this first log correction factor, $\ln(1+e^{-|A-B|})$, becomes a value of zero. Analogously, as the sum of the first value and the second value, i.e. A+B, becomes either larger or smaller, this second log correction factor, $-\ln(1+e^{-|A+B|})$, becomes a value of zero.

These properties also allows for a significant reduction in the memory (and subsequently size of a memory storage device) that is required to store the possible values of these log correction factors for use in max processing. This is directly analogous to the savings provided by similar characteristics of the log correction factors for use in min processing.

Several embodiments have been described above wherein various implementations of min processing and max processing may be constructed to perform processing of input values, A and B. As mentioned above, these principles and efficiencies provided by various aspects of the invention may benefit the calculations to be performed in a wide variety of communication devices including decoders. Some examples of types of decoders that may benefit from the invention include LDPC decoders, turbo decoder, TTCM decoders, and even other types of decoders that need to perform similar calculations. Some examples of application to LDPC decoding are provided below.

Figure 15:
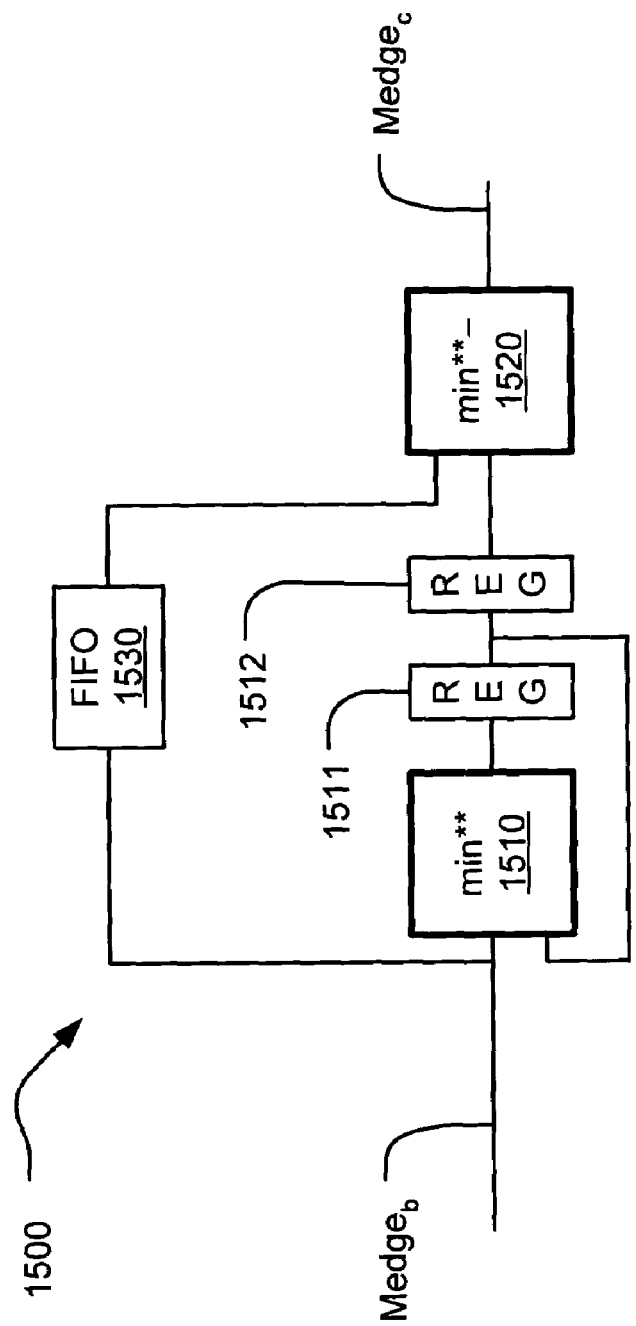
FIG. 15 and FIG. 16 are diagrams illustrating various embodiments of check node processing functionality, performing in accordance with LDPC decoding, according to certain aspects of the invention.
Figure 16:
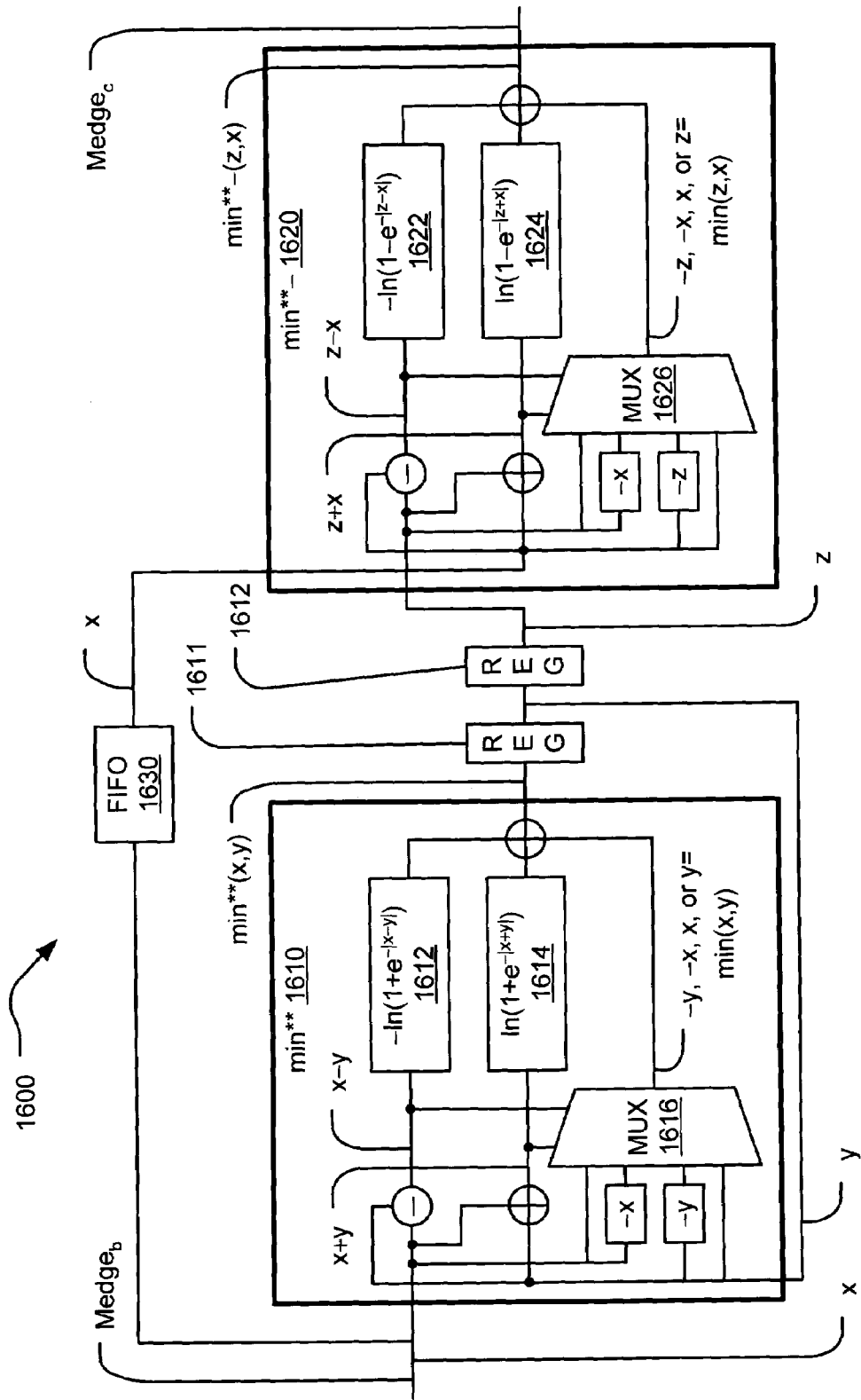

FIG. 15 and FIG. 16 are diagrams illustrating various embodiments of check node processing functionality, performing in accordance with LDPC decoding, according to certain aspects of the invention.

Referring to the check node processing functionality 1500 of FIG. 15, this diagram describes an embodiment that employs min processing and min− processing when updating the edge messages with respect to the check nodes, $Medge_c$, by using the edge messages with respect to the bit nodes, $Medge_b$. The most recently updated edge messages with respect to the bit nodes, $Medge_b$, are provided simultaneously to a min processing functional block 1510 and to a FIFO (First-In First-Out) 1530. As subsequent edge messages with respect to the bit nodes, $Medge_b$, are provided to the min processing functional block 1510, a register 1511 (shown as REG 1511) and a feedback path operate to perform the min processing of all of the edge messages with respect to the bit nodes, $Medge_b$. The final min processing resultant is provided from another register 1512 (shown as REG 1512) is provided to a min− processing functional block 1520 where the appropriately ordered edge messages with respect to the bit nodes, $Medge_b$, is provided from the FIFO 1530. The output of the min− processing functional block 1520 is the updated edge messages with respect to the check nodes, $Medge_c$.

Referring to the check node processing functionality 1600 of FIG. 16, this diagram may be viewed as one possible manner by which the check node processing functionality 1500 can be implemented.

From a higher view, the functionality of the check node processing functionality 1600 is very similar to the check node processing functionality 1500. In this diagram, more details are provided for a possible embodiment for a min processing functional block 1610 and a min− processing functional block 1620. From certain perspectives, the min processing functional block 1610 may be viewed as being depicted with reference to FIG. 7A, and the min− processing functional block 1620 may be viewed as being depicted with reference to FIG. 7B.

The min processing functional block 1610 receives as input the edge messages with respect to the bit nodes, $Medge_b$, which is also depicted as the value of x in the diagram. The min processing functional block 1610 operates by calculating two separate log correction factors, shown as $\ln(1+e^{-|x+y|})$ in a functional block 1614 and $-\ln(1+e^{-|x-y|})$ in a functional block 1612 as well as determining the minimum value of among two separate values (i.e., minimum of x and y). The determination of which value is the smallest of the two (either x or y) is determined by a multiplexor (MUX) 1616. To do this, the min processing functional block 1610 operates to calculate the two separate values of x−y and x+y. Each of these values is provided to the corresponding functional blocks 1612 and 1616, respectively, that calculate the corresponding log correction factors, shown as $\ln(1+e^{-|x+y|})$ in the functional block 1614 and $-\ln(1+e^{-|x-y|})$ in the functional block 1612**.

The output of the min processing functional block 1610 is the sum of the minimum value (x or y) and these two separate log correction factors, shown as $\ln(1+e^{-|x+y|})$ in the functional block 1614 and $-\ln(1+e^{-|x-y|})$ in the functional block 1612. The value of y is the output of the min functional block 1610 that is fed back to the very same min functional block 1610, via a register 1611 (shown as REG 1611**), for subsequent calculations.

The min− processing functional block 1620 operates somewhat similarly to the min processing functional block 1610. However, the min− processing functional block 1620 operates on the resultant of the min processing functional block 1610 (whose output is shown as z, and is provided via the register 1611 (shown as REG 1611) and a register 1612 (shown as REG 1612)), as well as the appropriately ordered edge message with respect to the bit nodes, $Medge_b$, that is provided from the FIFO 1630. This value of z may be viewed as being the min processing result of all of the edge messages with respect to the bit nodes (i.e., min(all $Medge_b$)).

The min− processing functional block 1620 operates by calculating two separate log correction factors, shown as $\ln(1-e^{-|z+x|})$ in a functional block 1624 and $-\ln(1-e^{-|z-x|})$ in a functional block 1622 as well as determining the minimum value of among two separate values (i.e., minimum of z and y). The determination of which value is the smallest of the two (either z or y) is determined by a multiplexor (MUX) 1626. To do this, the min− processing functional block 1620 operates to calculate the two separate values of z−x and z+x. Each of these values is provided to its corresponding block that calculates its corresponding log correction factor, shown as $\ln(1-e^{-|z+x|})$ in a functional block 1624 and $-\ln(1-e^{-|z-x|})$ in a functional block 1622.

The ultimate output from the min processing functional block 1610 and the min− processing functional block 1620 is the updated edge messages with respect to the check nodes, $Medge_c$. It is also noted that determination of the log correction factors within each of the min processing functional block 1610 and the min− processing functional block 1620 may be performed using LUTs (Look Up Tables) implemented using some other type of memory structures. To perform this using LUTs, two separate LUTs may be implemented within each of the min processing functional block 1610 and the min− processing functional block 1620.

Figure 17:
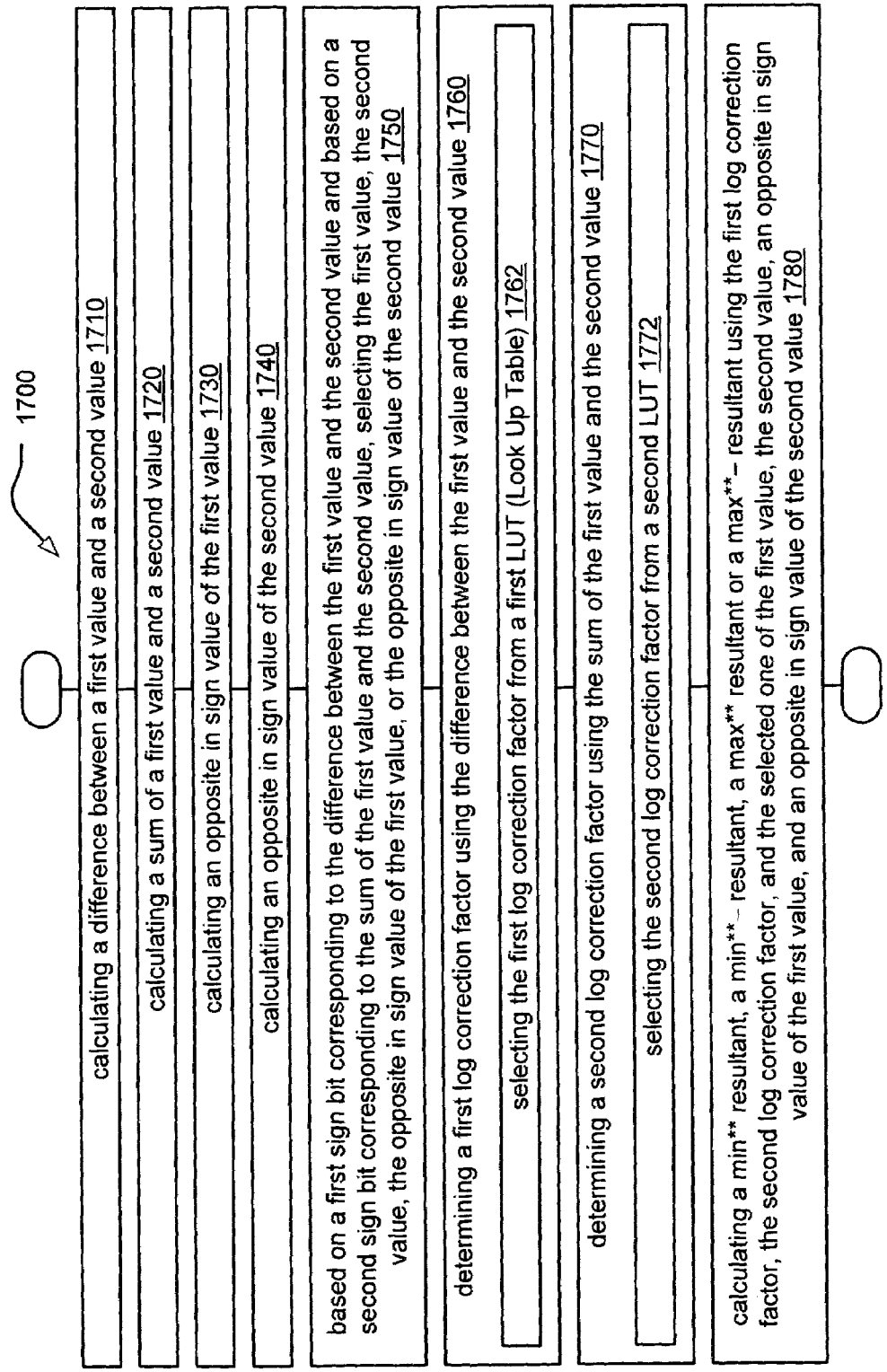
FIG. 17 is a flowchart illustrating an embodiment of a method for performing min processing, min− processing, max processing, or max− processing according to certain aspects of the invention.

FIG. 17 is a flowchart illustrating an embodiment of a method 1700 for performing min processing, min− processing, max processing, or max− processing according to certain aspects of the invention The method involves calculating a difference between a first value and a second value, as shown in a block 1710. Then, the method involves calculating a sum of a first value and a second value, as shown in a block 1720. The method also involves calculating an opposite in sign value of the first value, as shown in a block 1730. The method continues by calculating an opposite in sign value of the second value, as shown in a block 1740.

Then, the method involves selecting one of at least four possible values based on a first sign bit corresponding to the difference between the first value and the second value and based on a second sign bit corresponding to the sum of the first value and the second value. This process is shown within a block 1750. Based on a first sign bit corresponding to the difference between the first value and the second value and based on a second sign bit corresponding to the sum of the first value and the second value, selecting the first value, the second value, the opposite in sign value of the first value, or the opposite in sign value of the second value The method also involves determining a first log correction factor using the difference between the first value and the second value, as shown in a block 1760. This may also be performed by using an absolute value of the sum of the first value and the second value. It is also noted that the method may also involve selecting the first log correction factor from a first LUT (Look-Up Table), as shown in a block 1762. This first LUT may include a predetermined plurality of possible log correction factors that are stored in some type of memory device. The appropriate first log correction factor may be selected from the first LUT based on the absolute value of the difference between the first value and the second value.

The method also involves determining a second log correction factor using the sum of the first value and the second value, as shown in a block 1770. This may also be performed by using an absolute value of the difference between the first value and the second value. Similar to the LUT operation described above, it is also noted that the method may also involve selecting the second log correction factor from a second LUT, as shown in a block 1762. Similar to the first LUT, this second LUT may include a predetermined plurality of possible log correction factors that are stored in some type of memory device. The appropriate second log correction factor may be selected from the second LUT based on the absolute value of the sum of the first value and the second value.

The method involves calculating a min resultant, a min− resultant, a max resultant or a max− resultant using the first log correction factor, the second log correction factor, and the selected one of the first value, the second value, an opposite in sign value of the first value, and an opposite in sign value of the second value, as shown in a block 1780. The appropriate selected first log correction factor, the second log correction factor, and the selected one of the first value, the second value, an opposite in sign value of the first value, and an opposite in sign value of the second value will all be a function of the particular type of processing that is desired in a particular embodiment (e.g., be it min processing, a min− processing, a max processing or a max− processing). The reader is directed to the appropriate descriptions of each of these 4 types of processing provided above to determine the precise assignments for each of the first log correction factor, the second log correction factor, and the selected one of the first value, the second value, an opposite in sign value of the first value, and an opposite in sign value of the second value depending on the type of processing being performed.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A functional block that is operable to perform min** (min-double-star) processing in a decoder, the functional block comprising:
   a subtractor that is operable to calculate a difference between a first value and a second value;
   a summer that is operable to calculate a sum of the first value and the second value;
   a MUX (Multiplexor) that is operable to receive the first value, the second value, an opposite in sign value of the first value, and an opposite in sign value of the second value and whose select signals comprise a first sign bit corresponding to the difference between the first value and the second value and a second sign bit corresponding to the sum of the first value and the second value;
   a first log correction functional block that is operable to provide a first log correction factor based on an absolute value of the difference between the first value and the second value; and
   a second log correction functional block that is operable to provide a second log correction factor based on an absolute value of the sum of the first value and the second value.

2. The functional block of claim 1, further comprising:
   at least one additional summer that is operable to calculate min** resultant that comprises a sum of the first log correction factor, the second log correction factor, and an output of the MUX that is selected from the first value, the second value, an opposite in sign value of the first value, and an opposite in sign value of the second value.

3. The functional block of claim 1, wherein:
   the first log correction functional block includes a first LUT (Look-Up Table) that comprises a predetermined plurality of possible values of the first log correction factor; and
   the second log correction functional block includes a second LUT that comprises a predetermined plurality of possible values of the second log correction factor.

4. The functional block of claim 3, wherein:
   the predetermined plurality of possible values of the first log correction factor comprises a first bounded plurality of values; and
   the predetermined plurality of possible values of the second log correction factor comprises a second bounded plurality of values.

5. The functional block of claim 1, wherein:
   the MUX outputs the opposite in sign value of the second value when the first sign bit is less than zero and the second sign bit is less than zero;
   the MUX outputs the opposite in sign value of the first value when the first sign bit is greater than zero and the second sign bit is less than zero;
   the MUX outputs the first value when the first sign bit is less than zero and the second sign bit is greater than zero; and
   the MUX outputs the second value when the first sign bit is greater than zero and the second sign bit is greater than zero.

6. The functional block of claim 1, wherein:
   the functional block that is operable to perform min processing is communicatively coupled, via at last one register, to at least one additional functional block that is operable to perform min− (min-double-star-minus) processing;
   the functional block and the at least one additional functional block operate cooperatively to perform check node processing that involves updating a plurality of edge messages with respect to a plurality of check nodes using a plurality of edge messages with respect to the plurality of bit nodes; and
   the functional block and the at least one additional functional block are implemented within an LDPC (Low Density Parity Check) decoder that is operable to decode an LDPC coded signal.

7. A functional block that is operable to perform max** (max-double-star) processing in a decoder, the functional block comprising:
   a subtractor that is operable to calculate a difference between a first value and a second value;
   a summer that is operable to calculate a sum of the first value and the second value;
   a MUX (Multiplexor) that is operable to receive the first value, the second value, an opposite in sign value of the first value, and an opposite in sign value of the second value and whose select signals comprise a first sign bit corresponding to the difference between the first value and the second value and a second sign bit corresponding to the sum of the first value and the second value;
a first log correction functional block that is operable to provide a first log correction factor based on an absolute value of the difference between the first value and the second value; and
a second log correction functional block that is operable to provide a second log correction factor based on an absolute value of the sum of the first value and the second value.

8. The functional block of claim 7, further comprising:
at least one additional summer that is operable to calculate max** resultant that comprises a sum of the first log correction factor, the second log correction factor, and an output of the MUX that is selected from the first value, the second value, an opposite in sign value of the first value, and an opposite in sign value of the second value.

9. The functional block of claim 7, wherein:
the first log correction functional block includes a first LUT (Look-Up Table) that comprises a predetermined plurality of possible values of the first log correction factor; and
the second log correction functional block includes a second LUT that comprises a predetermined plurality of possible values of the second log correction factor.

10. The functional block of claim 9, wherein:
the predetermined plurality of possible values of the first log correction factor comprises a first bounded plurality of values; and
the predetermined plurality of possible values of the second log correction factor comprises a second bounded plurality of values.

11. The functional block of claim 7, wherein:
the MUX outputs the second value when the first sign bit is less than zero and the second sign bit is less than zero;
the MUX outputs the first value when the first sign bit is greater than zero and the second sign bit is less than zero;
the MUX outputs the opposite in sign value of the first value when the first sign bit is less than zero and the second sign bit is greater than zero; and
the MUX outputs the opposite in sign value of the second value when the first sign bit is greater than zero and the second sign bit is greater than zero.

12. The functional block of claim 7, wherein:
the functional block that is operable to perform max processing is communicatively coupled, via at last one register, to at least one additional functional block that is operable to perform max− (max-double-star-minus) processing;
the functional block and the at least one additional functional block operate cooperatively to perform check node processing that involves updating a plurality of edge messages with respect to a plurality of check nodes using a plurality of edge messages with respect to the plurality of bit nodes; and
the functional block and the at least one additional functional block are implemented within an LDPC (Low Density Parity Check) decoder that is operable to decode an LDPC coded signal.

13. A method for performing min (min-double-star) processing, min− (min-double-star-minus) processing, max (max-double-star) processing or max− (max-double-star-minus) processing, the method comprising:
calculating a difference between a first value and a second value;
calculating a sum of the first value and the second value;
calculating an opposite in sign value of the first value;
calculating an opposite in sign value of the second value;
based on a first sign bit corresponding to the difference between the first value and the second value and based on a second sign bit corresponding to the sum of the first value and the second value, selecting the first value, the second value, the opposite in sign value of the first value, or the opposite in sign value of the second value;
determining a first log correction factor based on an absolute value of the difference between the first value and the second value; and
determining a second log correction factor based on an absolute value of the sum of the first value and the second value.

14. The method of claim 13, further comprising:
calculating a min resultant, a min− resultant, a max resultant, or a max− resultant using the first log correction factor, the second log correction factor, and the selected one of the first value, the second value, the opposite in sign value of the first value, and the opposite in sign value of the second value.

15. The method of claim 13, further comprising:
selecting the first log correction factor from a first LUT (Look-Up Table) that comprises a predetermined plurality of possible values of the first log correction factor; and
selecting the second log correction factor from a second LUT that comprises a predetermined plurality of possible values of the second log correction factor.

16. The method of claim 15; wherein:
the predetermined plurality of possible values of the first log correction factor comprises a first bounded plurality of values; and
the predetermined plurality of possible values of the second log correction factor comprises a second bounded plurality of values.

17. The method of claim 13, when the method performs min** processing, further comprising:
selecting the opposite in sign value of the second value when the first sign bit is less than zero and the second sign bit is less than zero;
selecting the opposite in sign value of the first value when the first sign bit is greater than zero and the second sign bit is less than zero;
selecting the first value when the first sign bit is less than zero and the second sign bit is greater than zero; and
selecting the second value when the first sign bit is greater than zero and the second sign bit is greater than zero.

18. The method of claim 13, when the method performs max** processing, further comprising:
selecting the second value when the first sign bit is less than zero and the second sign bit is less than zero;
selecting the first value when the first sign bit is greater than zero and the second sign bit is less than zero;
selecting the opposite in sign value of the first value when the first sign bit is less than zero and the second sign bit is greater than zero; and
selecting the opposite in sign value of the second value when the first sign bit is greater than zero and the second sign bit is greater than zero.

19. The method of claim 13, further comprising:
cooperatively performing min processing and min− (max-double-star-minus) processing to perform check node processing that involves updating a plurality of edge messages with respect to a plurality of check nodes using a plurality of edge messages with respect to the plurality of bit nodes during decoding of an LDPC (Low Density Parity Check) coded signal.

20. The method of claim 13, further comprising:

cooperatively performing max processing and max- (max-double-star-minus) processing to perform check node processing that involves updating a plurality of edge messages with respect to a plurality of check nodes using a plurality of edge messages with respect to the plurality of bit nodes during decoding of an LDPC (Low Density Parity Check) coded signal.

* * * * *